(12) United States Patent
Chai et al.

(10) Patent No.: US 12,087,228 B2
(45) Date of Patent: *Sep. 10, 2024

(54) DISPLAY APPARATUS HAVING PIXEL INCLUDING THREE TRANSISTORS AND TWO CAPACITORS, AND METHOD OF DRIVING THE SAME

(71) Applicants: Samsung Display Co., Ltd., Yongin-Si (KR); Industry-University Cooperation Foundation Hanyang University, Seoul (KR)

(72) Inventors: Chong-Chul Chai, Seoul (KR); Oh-Kyong Kwon, Seoul (KR); Nack-Hyeon Keum, Daegu (KR); Kyong-Hwan Oh, Seoul (KR); Young-Wan Seo, Suwon-si (KR); Yong-Koo Her, Yongin-si (KR); In-Jae Hwang, Suwon-si (KR)

(73) Assignees: Samsung Display Co., Ltd., Yongin-si (KR); Industry-University Cooperation Foundation Hanyang University, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/123,334

(22) Filed: Mar. 20, 2023

(65) Prior Publication Data
US 2023/0230546 A1    Jul. 20, 2023

Related U.S. Application Data

(60) Continuation of application No. 17/449,642, filed on Sep. 30, 2021, now Pat. No. 11,610,547, which is a
(Continued)

(30) Foreign Application Priority Data

May 18, 2016 (KR) .................. 10-2016-0061093

(51) Int. Cl.
    *G09G 3/3258* (2016.01)
    *G09G 3/3233* (2016.01)
    *G09G 3/3266* (2016.01)

(52) U.S. Cl.
    CPC ......... *G09G 3/3258* (2013.01); *G09G 3/3233* (2013.01); *G09G 3/3266* (2013.01);
    (Continued)

(58) Field of Classification Search
    CPC ... G09G 2300/0426; G09G 2300/0819; G09G 2300/0852; G09G 2300/0866;
    (Continued)

(56) References Cited

U.S. PATENT DOCUMENTS 7,800,576 B2    9/2010 Jinta
8,232,986 B2    7/2012 Kim et al.
(Continued)

FOREIGN PATENT DOCUMENTS

CN    101582235 A    11/2009
CN    101625833 A    1/2010
(Continued)

OTHER PUBLICATIONS

Baek-Woon Lee, "51.1. Novel Simultaneous Emission Driving Scheme for Crosstalk-free 3D AMOLED TV", SID Symposium Digest of Technical Papers, May 2010, pp. 758-761, vol. 41.
(Continued)

*Primary Examiner* — Chun-Nan Lin
(74) *Attorney, Agent, or Firm* — Innovation Counsel LLP

(57) ABSTRACT

A display apparatus includes a plurality of pixels. A pixel includes a first capacitor connected between a first voltage line receiving a first driving signal and a first node, a first transistor comprising a control electrode connected to the first node, a first electrode connected to a second voltage line receiving a first power source signal and a second electrode
(Continued)

connected to a second node, an organic light emitting diode comprising an anode electrode connected to the second node and a cathode electrode receiving a second power source signal, a second capacitor connected between an m-th data line and the second node (wherein, 'm' is a natural number) and a second transistor comprising a control electrode connected to an n-th scan line (wherein, 'n' is a natural number), a first electrode connected to the first node and a second electrode connected to the second node.

8 Claims, 23 Drawing Sheets

Related U.S. Application Data division of application No. 16/908,803, filed on Jun. 23, 2020, now Pat. No. 11,164,525, which is a division of application No. 16/391,142, filed on Apr. 22, 2019, now Pat. No. 10,733,938, which is a continuation of application No. 15/400,465, filed on Jan. 6, 2017, now Pat. No. 10,311,793.

(52) U.S. Cl.
CPC ........... *G09G 2300/0426* (2013.01); *G09G 2300/0819* (2013.01); *G09G 2300/0852* (2013.01); *G09G 2300/0866* (2013.01); *G09G 2310/063* (2013.01); *G09G 2320/02* (2013.01); *G09G 2320/043* (2013.01); *G09G 2330/021* (2013.01)

(58) Field of Classification Search
CPC ......... G09G 2310/063; G09G 2320/02; G09G 2320/043; G09G 2330/021; G09G 3/3233; G09G 3/3258; G09G 3/3266
See application file for complete search history.

(56) References Cited

U.S. PATENT DOCUMENTS

| | | |
|---|---|---|
| 8,907,869 B2 | 12/2014 | Chun |
| 9,105,236 B2 | 8/2015 | Shim et al. |
| 9,224,335 B2 | 12/2015 | Yoon et al. |
| 2005/0057556 A1 | 3/2005 | Kubota et al. |
| 2006/0028408 A1 | 2/2006 | Kim |
| 2006/0044244 A1* | 3/2006 | Numao ................ G09G 3/3233 345/92 |
| 2008/0136795 A1* | 6/2008 | Numao ................ G09G 3/3233 345/204 |
| 2008/0246026 A1 | 10/2008 | Kim |
| 2009/0115707 A1 | 5/2009 | Park et al. |
| 2010/0091006 A1* | 4/2010 | Yoo ...................... G09G 3/3233 345/213 |
| 2010/0244036 A1 | 9/2010 | Park et al. |
| 2015/0380104 A1 | 3/2015 | Park et al. |
| 2015/0380090 A1 | 12/2015 | Park et al. |
| 2017/0162101 A1* | 6/2017 | Ohara .................... H10K 59/12 |
| 2017/0337872 A1 | 11/2017 | Chai et al. |

FOREIGN PATENT DOCUMENTS

| | | |
|---|---|---|
| CN | 103050082 A | 4/2013 |
| CN | 103915061 A | 7/2014 |
| KR | 10-2007-0112714 A | 11/2007 |
| KR | 10-0926634 B1 | 11/2009 |
| KR | 10-2014-0025781 A | 3/2014 |
| KR | 20170081082 A * | 12/2015 ........... G09G 3/3233 |

OTHER PUBLICATIONS

S.M. Choi, "A Self-compensated Voltage Programming Pixel Structure for Active-Matrix Organic Light Emitting Diodes", IDW, 2003, pp. 535-538.

European Search Report, Application No. 17171826.5, Aug. 3, 2017, pp. 1-14.

* cited by examiner

FIG. 1
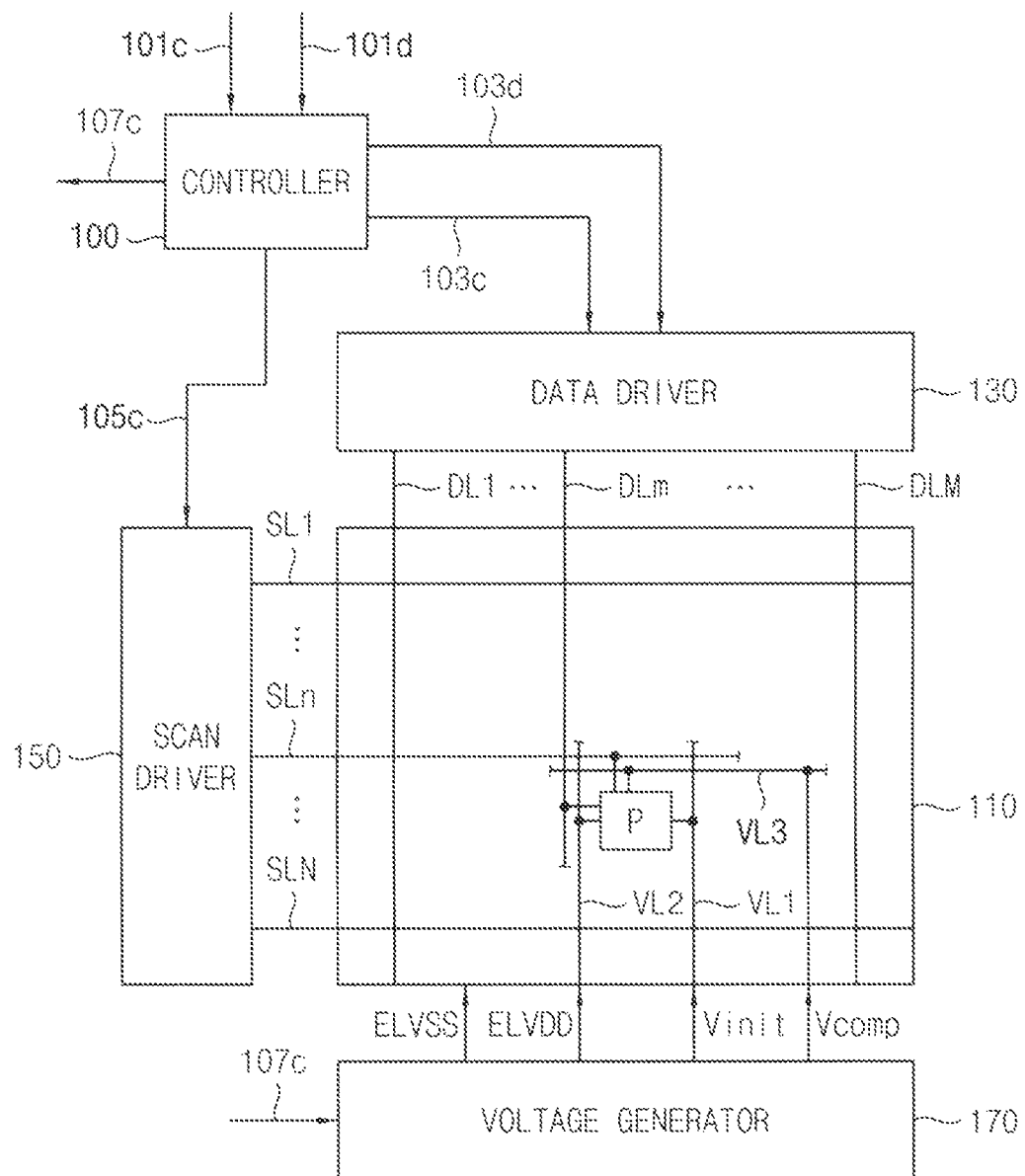
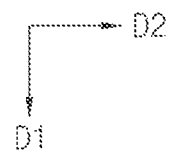

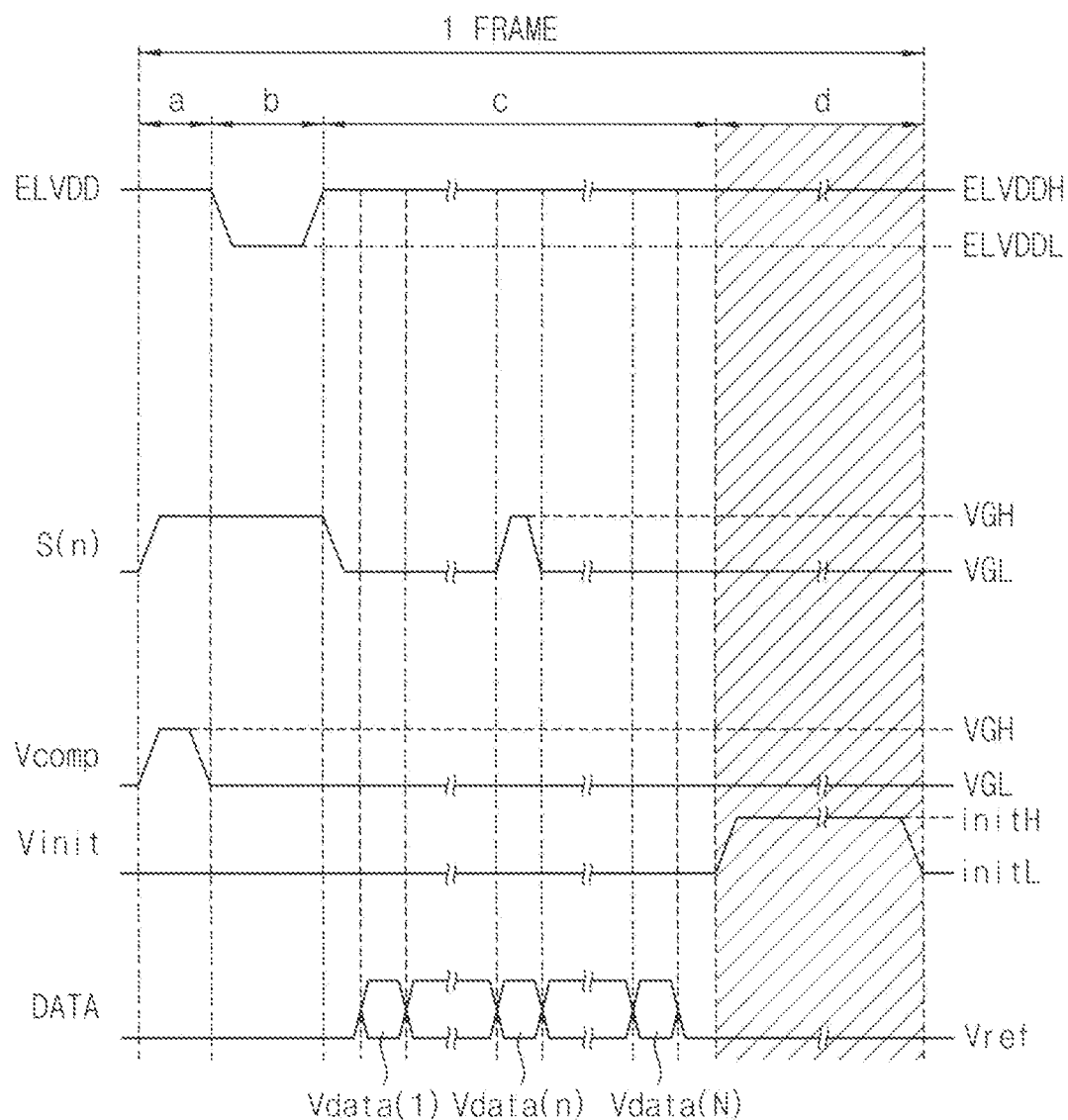

DISPLAY APPARATUS HAVING PIXEL INCLUDING THREE TRANSISTORS AND TWO CAPACITORS, AND METHOD OF DRIVING THE SAME

This application is a continuation application of U.S. patent application Ser. No. 17/449,642 filed on Sep. 30, 2021, now U.S. Pat. No. 11,610,547, which is a divisional application of U.S. patent application Ser. No. 16/908,803 filed on Jun. 23, 2020, now U.S. Pat. No. 11,164,525, which is a divisional application of U.S. patent application Ser. No. 16/391,142 filed on Apr. 22, 2019, now U.S. Pat. No. 10,733,938, which is a continuation application of U.S. patent application Ser. No. 15/400,465 filed on Jan. 6, 2017, now U.S. Pat. No. 10,311,793, which claims priority under 35 USC § 119 to Korean Patent Application No. 10-2016-0061093 filed on May 18, 2016, in the Korean Intellectual Property Office, the disclosures of which are incorporated herein in their entireties by reference.

BACKGROUND

1. Field

Exemplary embodiments of the inventive concept relate to a display apparatus and a method of driving the display apparatus. More particularly, example embodiments of the inventive concept relate to a display apparatus having a simple pixel structure and a method of driving the display apparatus.

2. Description of the Related Art

Recently, various flat panel display devices that reduce weight and volume have been developed. The flat panel display devices include a liquid crystal display (LCD) device, a field emission display (FED) device, a plasma display panel (PDP) device, an organic light emitting display (OLED) device, etc.

The OLED device has advantages such as rapid response speed and low power consumption because the OLED device among the flat panel display devices displays an image using an organic light emitting diode that emits a light during recombination of electrons and holes.

BRIEF SUMMARY

Exemplary embodiments of the inventive concept provide a display apparatus for improving a display quality in a standby mode that is a low-power mode.

Exemplary embodiments of the inventive concept provide a method of driving the display apparatus.

According to an exemplary embodiment of the inventive concept, there is provided a display apparatus. The display apparatus includes a plurality of pixels. A pixel of the plurality of pixels includes a first capacitor connected between a first voltage line receiving a first driving signal and a first node, a first transistor comprising a control electrode connected to the first node, a first electrode connected to a second voltage line receiving a first power source signal and a second electrode connected to a second node, an organic light emitting diode comprising an anode electrode connected to the second node and a cathode electrode receiving a second power source signal, a second capacitor connected between an m-th data line and the second node (wherein, 'm' is a natural number) and a second transistor comprising a control electrode connected to an n-th scan line (wherein, 'n' is a natural number), a first electrode connected to the first node and a second electrode connected to the second node.

In an exemplary embodiment, the pixel may further include a third transistor comprising a control electrode connected to a third voltage line receiving a second driving signal, a first electrode connected to the first voltage line and a second electrode connected to the second node.

In an exemplary embodiment, each of the first, second and third transistors may be an N-type transistor.

In an exemplary embodiment, during a first period of a frame period, the first voltage line may receive a low voltage of a first driving signal, the second voltage line may receive a high voltage of the first power source signal, the third voltage line may receive a high voltage of the second driving signal and the n-th scan line may receive a high voltage of a scan signal.

In an exemplary embodiment, during a second period of the frame period, the first voltage line may receive a low voltage of the first driving signal, the second voltage line may receive a low voltage of the first power source signal lower than the low voltage of the first driving signal, the third voltage line may receive a low voltage of the second driving signal, and the n-th scan line may receive a high voltage of the scan signal.

In an exemplary embodiment, during a third period of the frame period, the first voltage line may receive a low voltage of the first driving signal, the second voltage line may receive a high voltage of the first power source signal, the third voltage line may receive a low voltage of the second driving signal, the n-th scan line may receive a high voltage of the scan signal during an n-th horizontal period in the third period, and the m-th data line may receive a data voltage corresponding to a plurality of horizontal lines.

In an exemplary embodiment, during the n-th horizontal period, a data voltage corresponding to an n-th horizontal line may be divided by a voltage division ratio of the first and second capacitors which are connected in series and divided voltage may be applied to the first node.

In an exemplary embodiment, the m-th data line may receive s a reference voltage before the m-th data line receives a data voltage corresponding to a first horizontal line of a plurality of horizontal lines, and the m-th data line may receive a reference voltage after the m-th data line receives a data voltage corresponding to a last horizontal line of a plurality of horizontal lines.

In an exemplary embodiment, the m-th data line may receive a reference voltage before the first voltage line receives a high voltage of the first driving signal and, the reference voltage may be equal to or lower than a lowest voltage in a voltage range of the data voltage.

In an exemplary embodiment, during a fourth period of the frame period, the first voltage line may receive a high voltage of the first driving signal, the second voltage line may receive a high voltage of the first power source signal, the third voltage line may receive a low voltage of the second driving signal, and the n-th scan line may receive a low voltage of the scan signal.

In an exemplary embodiment, when a difference voltage between the high voltage and the low voltage of the first driving signal is applied to the first node, the first transistor may be turned on and a driving current corresponding to the data voltage applied to the first node may flow through the organic light emitting diode.

In an exemplary embodiment, each of the first, second and third transistors may be a P-type transistor.

In an exemplary embodiment, during a first period, the first voltage line may receive a low voltage of the first driving signal, the second voltage line may receive a low voltage of the first power source signal, the third voltage line may receive a low voltage of the second driving signal, and the n-th scan line receives a low voltage of the scan signal.

In an exemplary embodiment, the low voltage of the first power source signal may be higher than the low voltage of the first driving signal.

In an exemplary embodiment, during a second period of the frame period, the first voltage line may receive a low voltage of the first driving signal, the second voltage line may receive a low voltage of the first power source signal, the third voltage line may receive a high voltage of the second driving signal and the n-th scan line may receive a low voltage of the scan signal.

In an exemplary embodiment, during a third period of the fame period, the first voltage line may receive a low voltage of the first driving signal, the second voltage line may receive a low voltage of the first power source signal, the third voltage line may receive a high voltage of the second driving signal, the n-th scan line may receive a low voltage of the scan signal during an n-th horizontal period in the third period, and the m-th data line may receive a data voltage corresponding to a plurality of horizontal lines.

In an exemplary embodiment, during the n-th horizontal period, a data voltage corresponding to an n-th horizontal line may be divided by a voltage division ratio of the first and second capacitors which are connected in series and divided voltage may be applied to the first node.

In an exemplary embodiment, the m-th data line may receive a reference voltage before the m-th data line receives a data voltage corresponding to a first horizontal line of a plurality of horizontal lines, and the m-th data line may receive a reference voltage after the m-th data line receives a data voltage corresponding to a last horizontal line of a plurality of horizontal lines.

In an exemplary embodiment, the m-th data line may receive a reference voltage before the first voltage line receives a high voltage of the first driving signal, and the reference voltage mat be equal to or lower than a lowest voltage in a voltage range of the data voltage.

In an exemplary embodiment, during a fourth period of the frame period, the first voltage line may receive a high voltage of the first driving signal, the second voltage line may receive a high voltage of the first power source signal, the third voltage line may receive a high voltage of the second driving signal, and the n-th scan line may receive a high voltage of the scan signal.

In an exemplary embodiment, when a difference voltage between the high voltage and the low voltage of the first driving signal may be applied to the first node, the first transistor is turned on and a driving current corresponding to the data voltage applied to the first node may flow through the organic light emitting diode.

In an exemplary embodiment, at least one of the second and third transistors may have a dual gate structure.

In an exemplary embodiment, a first insulating interlayer may be disposed on the control electrode of the first transistor and a first electrode of the first capacitor, the first voltage line and the second electrode of the first capacitor which are disposed on the first insulating interlayer, a second insulating interlayer may be disposed on the first voltage line and the second electrode of the first capacitor, the m-th data line and a first electrode of the second capacitor which are disposed on the second insulating interlayer, and a third insulating interlayer may be disposed on the m-th data line and a first electrode of the second capacitor, the second voltage line and a second electrode of the second capacitor which are disposed on the third insulating interlayer.

According to an exemplary embodiment of the inventive concept, there is provided a method of a display apparatus which includes a plurality of pixels which respectively comprises an organic light emitting diode. The method includes applying a low voltage of a first driving signal to an anode electrode of the organic light emitting diode to initialize the anode electrode, applying a low voltage of a first power source signal to a first electrode of a first transistor to diode-connect the first transistor, dividing a data voltage applied to a data line using first and second capacitors which are connected in series to apply divided voltage to a control electrode of the first transistor; and applying a high voltage of the first driving signal to the control electrode of the first transistor to emit a light from the organic light emitting diode.

In an exemplary embodiment, when the first transistor may be an N-type transistor, the low voltage of the first power source signal may be lower than the low voltage of the first driving signal, and the low voltages of the first power source signal and the first driving signal may be lower than a voltage of second power source signal applied to a cathode electrode of the organic light emitting diode.

In an exemplary embodiment, when the first transistor may be a P-type transistor, the low voltage of the first power source signal may be higher than the low voltage of the first driving signal, and the low voltages of the first power source signal and the first driving signal may be lower than a voltage of second power source signal applied to a cathode electrode of the organic light emitting diode.

In an exemplary embodiment, a difference between the high and low voltages of the first driving signal may be applied to a control electrode of the first transistor, a high voltage of the first driving signal being preset based on a turn-on voltage of the first transistor.

In an exemplary embodiment, the method may further include applying a reference voltage to a data line before the data line receives a data voltage corresponding to a first horizontal line of a plurality of horizontal lines, and applying the reference voltage to the data line after the data line receives a data voltage corresponding to a last horizontal line of a plurality of horizontal lines.

In an exemplary embodiment, the data line may receive the reference voltage before a control electrode of the first transistor receives the high voltage of the first driving signal.

In an exemplary embodiment, each of initializing the anode electrode, diode-coupling the first transistor and emitting the light from the organic light emitting diode may be simultaneously performed in all pixels.

According to an exemplary embodiment of the inventive concept, there is provided a display device. The display device includes a plurality of pixels. A pixel of the plurality of pixels includes a first transistor comprising a control electrode connected to a first node, a first electrode connected to a second voltage line receiving a first power source signal and a second electrode connected to a second node, a first capacitor connected between a first voltage line receiving a first driving signal and the first node, an organic light emitting diode comprising an anode electrode connected to the second node and a cathode electrode receiving a second power source signal, and a second capacitor connected between an m-th data line and the second node (wherein, 'm' is a natural number.

In an exemplary embodiment, the pixel may further include a second transistor comprising a control electrode connected to an n-th scan line (wherein, 'n' is a natural number), a first electrode connected to the first node and a second electrode connected to the second node In an exemplary embodiment, the pixel may further include a third transistor comprising a control electrode connected to a third voltage line receiving a second driving signal, a first electrode connected to the first voltage line and a second electrode connected to the second node.

In an exemplary embodiment, each of the first, second and third transistors may be an N-type transistor, and a low voltage of the first driving signal is greater than a sum of a low voltage of the first power source and a threshold voltage of the first transistor and less than a sum of the second power source signal and a turn on voltage of the organic light emitting diode.

In an exemplary embodiment, each of the first, second and third transistors is a P-type transistor, and a low voltage of the first power source signal is greater than a low voltage of the first driving signal and less than the second power source signal.

According to the inventive concept, the pixel circuit may include only three transistors and two capacitors and thus, an ultra high definition display may be easily designed using the pixel circuit. In addition, the compensating period in the frame period may be freely controlled and thus, sufficiently obtained. In addition, whether the organic light emitting diode emits or not the light may be controlled by adjusting a level of the first power source signal.

BRIEF DESCRIPTION OF THE DRAWINGS

The above and other features and advantages of the inventive concept will become more apparent by describing in detailed exemplary embodiments thereof with reference to the accompanying drawings, in which:

FIG. 1 is a block diagram illustrating a display apparatus according to an exemplary embodiment;

FIGS. 7A and 7B are conceptual diagrams illustrating a method of driving the pixel circuit according to an exemplary embodiment;

DETAILED DESCRIPTION

Figure 2:
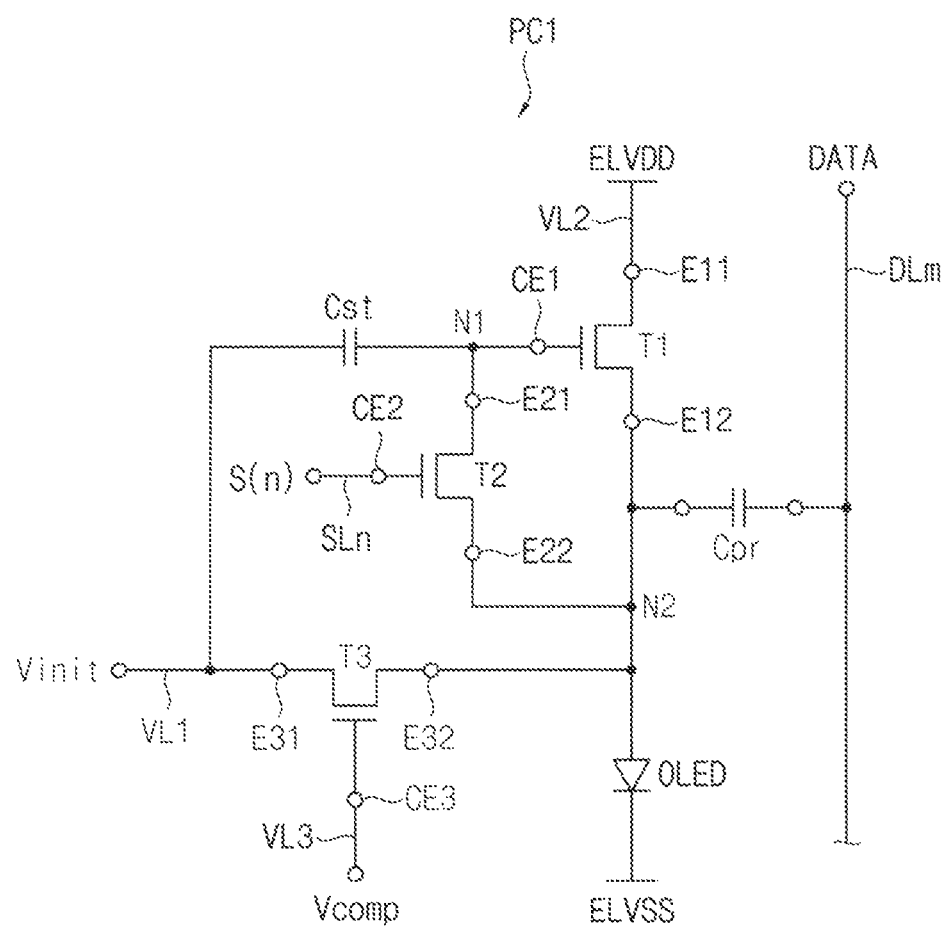
FIG. 2 is a circuit diagram illustrating a pixel circuit according to an exemplary embodiment.

Hereinafter, the inventive concept will be explained in detail with reference to the accompanying drawings.

FIG. 1 is a block diagram illustrating a display apparatus according to an exemplary embodiment.

Referring to FIG. 1, the display apparatus may include a controller 100, a display part 110, a data driver 130, a scan driver 150 and a voltage generator 170.

The controller 100 may be configured to generally control the display apparatus to display an image on the display part 110. The controller 100 is configured to receive a control signal 101c and image data 101d. The controller 100 is configured to provide the data driver 130 with a data control signal 103c and the image data 103d in order to drive the data driver 130. The controller 100 is configured to provide the scan driver 150 with a scan control signal 105c in order to drive the scan driver 150. The controller 100 is configured to provide the voltage generator 170 with a voltage control signal 107c in order to drive the voltage generator 170.

The controller 100 is configured to drive the display part 110 during a frame period which may include an initializing period, a compensating period, a data-programming period and a light-emitting period.

The display part 110 may include a plurality of pixels P, a plurality of data lines DL1, . . . , DLm, . . . , DLM, a plurality of scan lines SL1, . . . , SLn, . . . , SLN, a first voltage line VL1, a second voltage line VL2 and a third voltage line VL3.

Each of the plurality of pixels P may include an organic light emitting diode and three transistors and two capacitors, which drive the organic light emitting diode.

The data lines DL1, . . . , DLm, . . . , DLM may respectively extend in a first direction D1 and be arranged in a second direction D2 crossing the first direction D1. Each data line DLm is configured to transfer a data voltage to pixels P in a same pixel-column which are arranged in the first direction D1.

The scan lines SL1, . . . , SLn, . . . , SLN may extend in the second direction D2 and be arranged in the first direction D1. Each scan line SLn is configured to transfer a scan signal to pixels P in a same pixel-row which are arranged in the second direction D2.

The first voltage line VL1 may transfer a first driving signal Vinit to the plurality of pixels P and the plurality of pixels P may commonly use the first voltage line VL1.

The second voltage line VL2 may transfer a first power source signal ELVDD to the plurality of pixels P and the plurality of pixels P may commonly use the second voltage line VL2.

The third voltage line VL3 may transfer a second driving signal Vcomp to the plurality of pixels P and the plurality of pixels P may commonly use the third voltage line VL3.

The data driver 130 is configured to provide the data lines DL1, . . . , DLm, . . . , DLM with the data voltage corresponding to the image data during the data-programming period of the frame period.

In addition, the data driver 130 is configured to provide the data lines DL1, . . . , DLm, . . . , DLM with a reference voltage before or after the data-programming period. The reference voltage may be equal to or lower than a black voltage corresponding to a black grayscale.

The scan driver 150 is configured to sequentially provide the scan lines SL1, . . . , SLn, . . . , SLN with the scan signals. The scan signal may have a high voltage and a low voltage.

The voltage generator 170 is configured to generate the first driving signal Vinit, the second driving signal Vcomp, the first power source signal ELVDD and a second power source signal ELVSS.

The first driving signal Vinit is applied to the first voltage line VL1 and has a high voltage and a low voltage. The high voltage and the low voltage of the first driving signal Vinit may have predetermined high and low voltages for driving the pixel P, respectively.

The second driving signal Vcomp is applied to the third voltage line VL3 and has a high voltage and a low voltage. The high voltage and the low voltage of the second driving signal Vcomp may respectively correspond to the high voltage and the low voltage of the scan signal.

The first power source signal ELVDD is applied to the second voltage line VL2 and has a high voltage and a low voltage. The high voltage of the first power source signal ELVDD may have a high voltage of a normal positive power source signal and the low voltage of the first power source signal ELVDD may have a predetermined low voltage for driving the pixel P.

The second power source signal ELVSS is applied to a common electrode of the pixels P, that is a cathode electrode of an organic light emitting diode and may have a low voltage of a normal negative power source signal.

FIG. 2 is a circuit diagram illustrating a pixel circuit according to an exemplary embodiment.

Referring to FIGS. 1 and 2, the pixel circuit PC1 may be included in the pixel P of the display part 110. The pixel circuit PC1 is an equivalent circuit of the pixel P.

The pixel circuit PC1 may include a first transistor T1, a second transistor T2, a third transistor T3, a first capacitor Cst, a second capacitor Cpr and an organic light emitting diode OLED.

According to the exemplary embodiment, each of the first, second and third transistors T1, T2 and T3 may be an N-type transistor. The N-type transistor may be turned on when a high voltage is applied to a control electrode, and turned off when a low voltage is applied to the control electrode. According to the exemplary embodiment, the high voltage may be a turn-on voltage of the N-type transistor and the low voltage may be a turn-off voltage of the N-type transistor.

The first transistor T1 may include a control electrode CE1 connected to a first node N1, a first electrode E11 connected to a second voltage line VL2 and a second electrode E12 connected to a second node N2. The second voltage line VL2 is configured to receive the first power source signal ELVDD.

The first power source signal ELVDD may have a high voltage which is a voltage of a normal positive power source signal and a low voltage which is a predetermined low voltage for driving the pixel circuit PC1. The first power source signal ELVDD may have the low voltage during the compensating period in which a threshold voltage of the first transistor T1 is compensated, and the high voltage during a remaining period of the frame period except for the compensating period.

The second transistor T2 may include a control electrode CE2 connected to the n-th scan line SLn, a first electrode E21 connected to the first node N1 and a second electrode E22 connected to the second node N2. The n-th scan line SLn is configured to receive an n-th scan signal S(n). The n-th scan signal S(n) may have a high voltage which turns on the second transistor T2 and a low voltage which turns off the second transistor T2. The second transistor T2 may diode-couple the first transistor T1 during the compensating period. That is, the second transistor T2 may connect the control electrode CE1 and the second node N2 of the first transistor T1 during the compensating period.

The third transistor T3 may include a control electrode CE3 connected to the third voltage line VL3, a first electrode E31 connected to the first voltage line VL1 and a second electrode E32 connected to the second node N2. The first voltage line VL1 is configured to receive a first driving signal Vinit.

The first driving signal Vinit may have high and low voltages which are predetermined high and low voltages driving the pixel circuit PC1. The first driving signal Vinit has the high voltage during the light-emitting period during which the organic light emitting diode OLED emits the light, and the low voltage during a remaining period of the frame period except for the light-emitting period.

The third voltage line VL3 is configured to receive the second driving signal Vcomp. The second driving signal Vcomp may have a high voltage which turns on the third transistor T3 and a low voltage which turns off the third transistor T3.

The first capacitor Cst may be connected between the first voltage line VL1 and the first node N1. The first capacitor Cst may store a node voltage applied to the first node N1.

The second capacitor Cpr may be connected between the second node N2 and m-th data line DLm. The second capacitor Cpr may store the data voltage applied to the m-th data line DLm.

The first and second capacitors Cst and Cpr may be serially connected between the m-th data line DLm and the first voltage line VL1 through the second transistor T2. The data voltage applied to the m-th data line DLm may be divided by a voltage division ratio of the first and second capacitors Cst and Cpr and divided data voltage may be applied to the first node N1.

The organic light emitting diode OLED may include an anode electrode connected to the second node N2 and a cathode electrode which receives the second power source signal ELVSS.

When the transistor T1 is turned on, a driving current corresponding to the data voltage applied to the first node N1 may flow through the organic light emitting diode OLED and thus, the organic light emitting diode OLED may emit the light.

Figure 3:
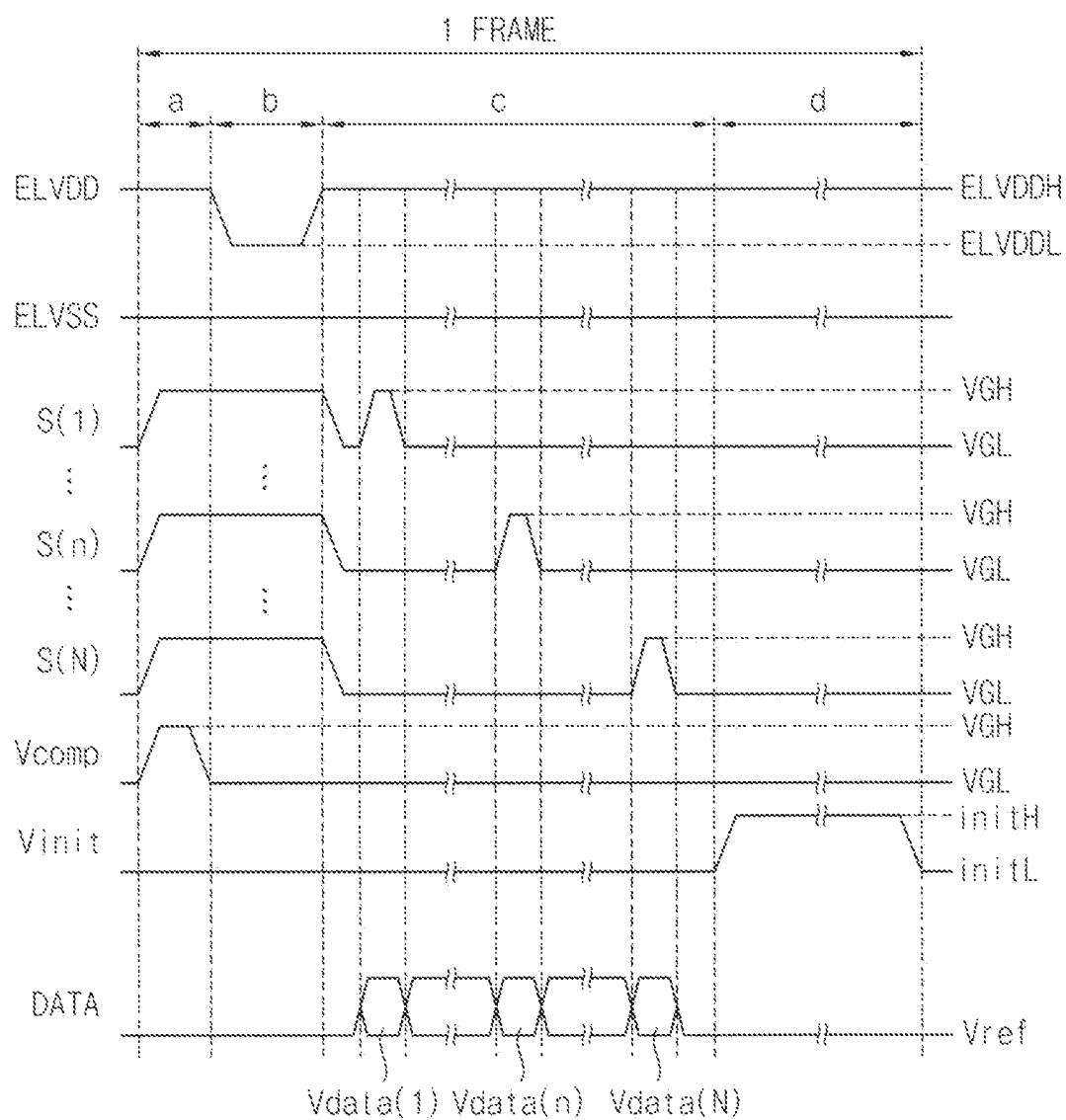
FIG. 3 is a timing chart illustrating a plurality of input signals of a display apparatus according to an exemplary embodiment.

FIG. 3 is a timing chart illustrating a plurality of input signals of a display apparatus according to an exemplary embodiment.

Referring to FIGS. 1, 2 and 3, the display part may receive a plurality of input signals. The plurality of input signal may include the first power source signal ELVDD applied to the second voltage line VL2, the first driving signal Vinit applied to the first voltage line VL1, the second driving signal Vcomp applied to the third voltage line VL3, a plurality of scan signals S(1), . . . , S(n), . . . S(N) applied to the plurality of scan lines, a data voltage DATA applied to the plurality of data lines and the second power source signal ELVSS applied to the cathode electrode of the organic light emitting diode OLED. The data voltage DATA may be referred to as a data voltage applied to the m-th data line DLm of the plurality of data lines.

The frame period may include a first period 'a' during which the anode electrode of the organic light emitting diode OLED is initialized, a second period 'b' during which the threshold voltage of the first transistor T1 is compensated, a third period 'c' during which the data voltage is applied to the pixel and a fourth period 'd' during which the organic light emitting diode OLED emit the light.

Referring to the first period 'a', the first voltage line VL1 receives a low voltage initL of the first driving signal Vinit. The low voltage initL of the first driving signal Vinit may be defined as the following Equation 1.

$$\text{ELVDD}_L + V_{th,T1} > \text{Init}_L < \text{ELVSS} + V_{onOLED} \quad \text{Equation 1}$$

In Equation 1, $V_{th,T1}$ represents a threshold voltage of the first transistor T1, $V_{on,OLED}$ represents a minimum voltage of the organic light emitting diode OLED while the organic light emitting diode OLED emits the light ('a turn on voltage of the organic light emitting diode OLED').

The third voltage line VL3 may receive a high voltage VGH of the second driving signal Vcomp. The high voltage VGH of the second driving signal Vcomp may have a turn-on voltage of the third transistor T3. For example, the high voltage VGH of the second driving signal Vcomp may be about 10 V.

The second voltage line VL2 may receive a high voltage ELVDDH of the first power source signal ELVDD. The high voltage ELVDDH of the first power source signal ELVDD may have a voltage of a normal positive power source signal.

For example, the low voltage initL of the first driving signal Vinit may be about −2.2 V, the high voltage ELVDDH of the first power source signal ELVDD may be about 7 V, the low voltage ELVDDL of the first power source signal ELVDD may be about −7 V, and the second power source signal ELVSS may be about 0 V.

The plurality of scan lines SL1, . . . , SLn, . . . , SLN may simultaneously receive the high voltages VGH of the plurality of scan signals S(1), . . . , S(n), . . . S(N). The high voltage VGH of the scan signal may have a turn-on voltage of the second transistor T2. For example, the high voltage VGH of the scan signal may be about 10 V.

The plurality of data lines DL1, . . . , DLm, . . . , DLM may receive a reference voltage Vref. The reference voltage Vref may be equal to or lower than a lowest voltage in a voltage range of the data voltage. For example, when the voltage range of the data voltage is about 0.5V to about 7.5 V, the reference voltage Vref may be equal to or lower than about 0.5 V.

During the first period 'a', the anode electrodes of the organic light emitting diodes OLED which is connected to the second node N2 and the first node N1 in all pixels may be initialized by the low voltage initL of the first driving signal Vinit, simultaneously.

Referring to the second period 'b', the first voltage line VL1 is configured to receive the low voltage initL of the first driving signal Vinit.

The third voltage line VL3 is configured to receive a low voltage VGL of second driving signal Vcomp. The low voltage VGL of the second driving signal Vcomp may have a turn-off voltage of the third transistor T3. For example, the low voltage VGL of the second driving signal Vcomp may be about −10 V.

The second voltage line VL2 is configured to receive a low voltage ELVDDL of the first power source signal ELVDD. For example, the low voltage ELVDDL of the first power source signal ELVDD may be about −7 V.

The plurality of scan lines SL1, . . . , SLn, . . . , SLN is configured to simultaneously receive high voltages VGH of the plurality of scan signals S(1), . . . , S(n), . . . S(N) as the first period 'a'.

The plurality of data lines DL1, . . . , DLm, . . . , DLM is configured to receive the reference voltage Vref as the first period 'a'.

During the second period 'b', the threshold voltages of the first transistors T1 in all pixels may be simultaneously compensated using the sum voltage of the low voltage ELVDDL of the first power source signal ELVDD and the threshold voltage $V_{th,T1}$ of corresponding first transistor T1.

Referring to the third period 'c', the second voltage line VL2 is configured to receive a high voltage ELVDDH of the first power source signal ELVDD.

The first voltage line VL1 is configured to receive the low voltage initL of the first driving signal Vinit.

The third voltage line VL3 is configured to receive the low voltage VGL of the second driving signal Vcomp.

The plurality of scan lines SL1, . . . , SLn, . . . , SLN is configured to sequentially receive high voltages VGH of the plurality of scan signals S(1), . . . , S(n), . . . S(N).

The plurality of data lines DL1, . . . , DLm, . . . , DLM is configured to receive the data voltage DATA respectively corresponding to the plurality of horizontal lines in synchronization with the high voltages VGH of the plurality of scan signals S(1), . . . , S(n), . . . S(N).

The first node N1 is configured to receive divided data voltage by a voltage division ratio of the first and second capacitors Cst and Cpr during a corresponding horizontal period of the pixel.

In addition, the third period 'c' may include at least one holding period during which the plurality of data lines DL1, . . . , DLm, . . . , DLM is configured to receive a reference voltage Vref. The holding period may be disposed before a first horizontal period in which a data voltage of a first horizontal line is applied to the plurality of data lines DL1, . . . , DLm, . . . , DLM and after a last horizontal period in which a data voltage of a last horizontal line is applied to the plurality of data lines DL1, . . . , DLm, . . . , DLM. Therefore, the plurality of data lines DL1, . . . , DLm, . . . , DLM may be maintained into the reference voltage Vref during the holding period.

Referring to the fourth period 'd', the second voltage line VL2 is configured to receive the high voltage ELVDDH of the first power source signal ELVDD.

The first voltage line VL1 is configured to receive a high voltage initH of the first driving signal Vinit. The high voltage initH of the first driving signal Vinit may be determined based on a turn-on voltage of the first transistor T1. For example, the high voltage initH of the first driving signal Vinit may be about 6.5 V.

The third voltage line VL3 is configured to receive the low voltage VGL of the second driving signal Vcomp.

The plurality of scan lines SL1, . . . , SLn, . . . , SLN is configured to simultaneously receive the low voltages VGL of the plurality of scan signals S(1), . . . , S(n), . . . S(N).

The plurality of data lines DL1, . . . , DLm, . . . , DLM is configured to simultaneously receive the reference voltage Vref.

During the fourth period 'd', driving current corresponding to the data voltage applied to the first node N1 may be provided to the organic light emitting diode OLED and the organic light emitting diode OLED may emit the light. Thus, the organic light emitting diodes OLED in all pixels may simultaneously emit the light.

Figure 4A:
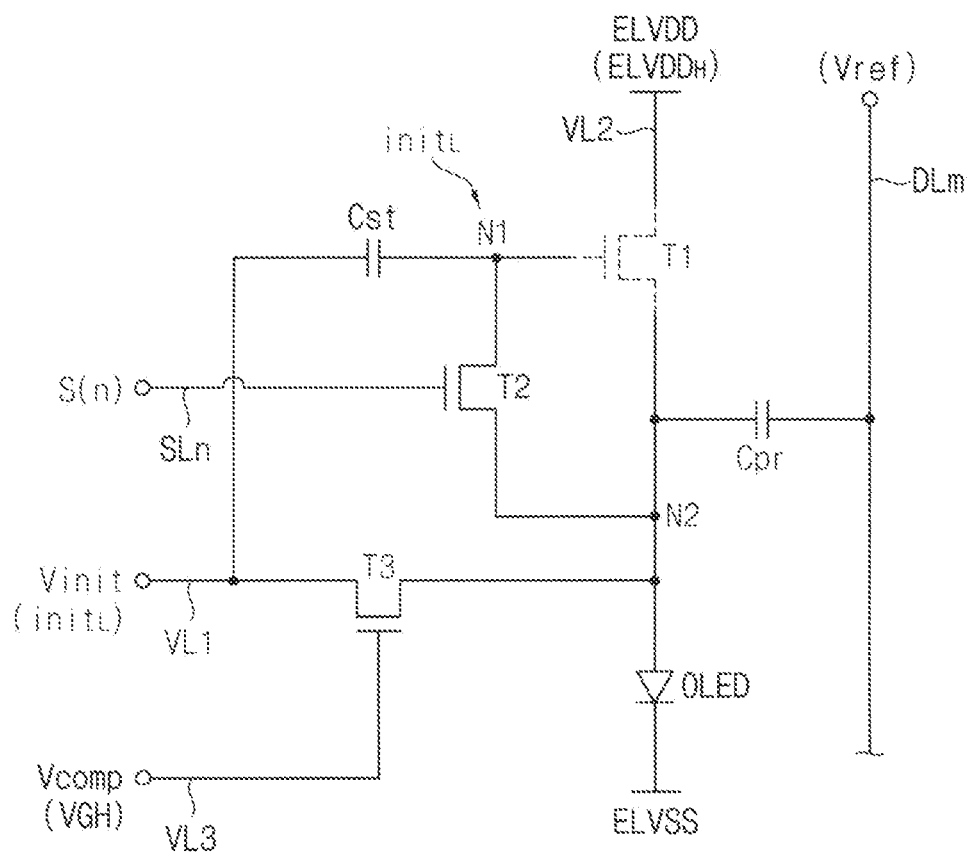
FIGS. 4A and 4B are conceptual diagrams illustrating a method of driving the pixel circuit according to an exemplary embodiment.
Figure 4B:
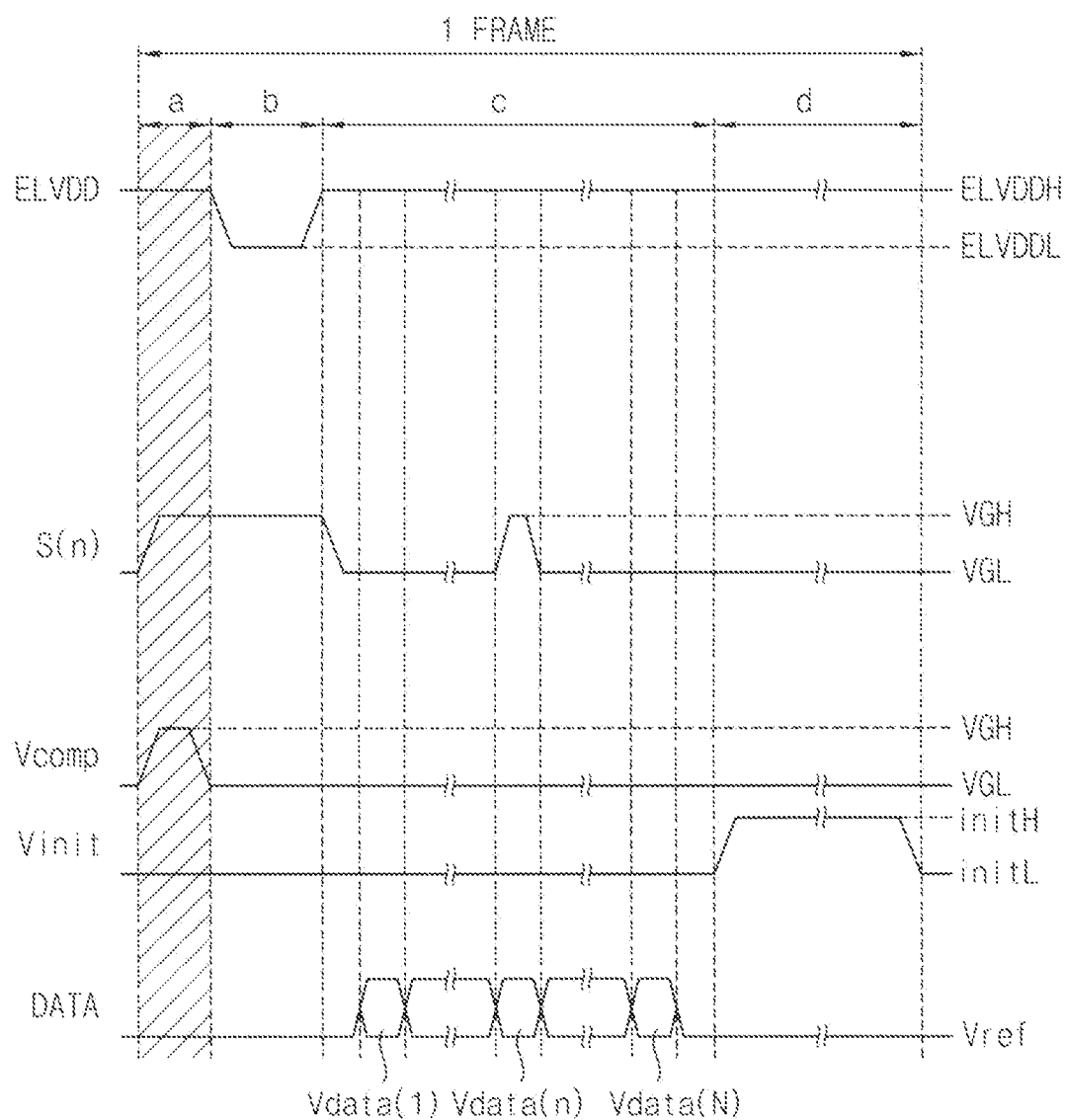

FIGS. 4A and 4B are conceptual diagrams illustrating a method of driving the pixel circuit according to an exemplary embodiment.

Referring to FIGS. 4A and 4B, the first period 'a' may correspond to an initializing period of the organic light emitting diode OLED.

In the first period 'a', the low voltage initL of first driving signal Vinit is applied to the first voltage line VL1, the high voltage VGH of the second driving signal Vcomp is applied to the third voltage line VL3, and the high voltage ELVDDH of the first power source signal ELVDD is applied to the second voltage line VL2. The n-th scan line SLn receives the high voltage VGH of the n-th scan signal S(n). The m-th data line DLm receives the reference voltage Vref.

Referring to a method of driving the pixel circuit PC1, the low voltage initL of the first driving signal Vinit is applied to the first node N1. The second transistor T2 is turned on in response to the high voltage VGH of the n-th scan signal S(n).

The third transistor T3 is turned on in response to the high voltage VGH of the second driving signal Vcomp, and then the low voltage initL of the first driving signal Vinit is provided to the second node N2. The anode electrode of the organic light emitting diode OLED connected to the second node N2 may be initialized by the low voltage initL of the first driving signal Vinit.

Therefore, during the first period 'a', the organic light emitting diode OLED may be initialized.

Figure 5A:
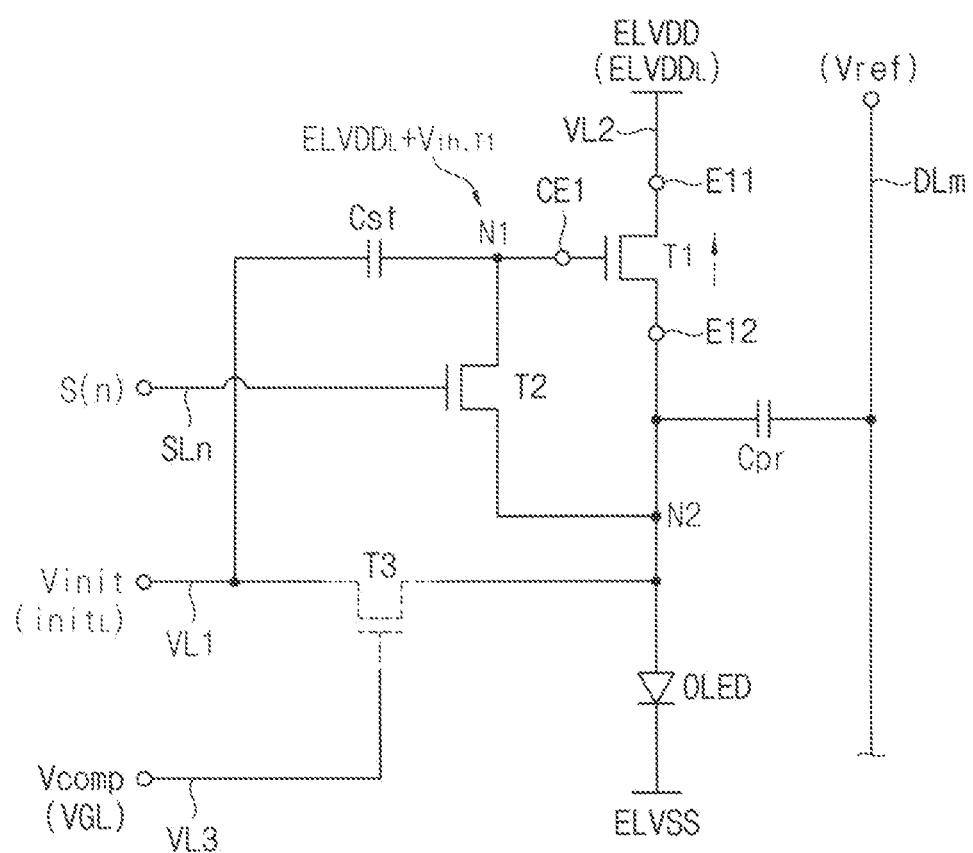
FIGS. 5A and 5B are conceptual diagrams illustrating a method of driving the pixel circuit according to an exemplary embodiment.
Figure 5B:
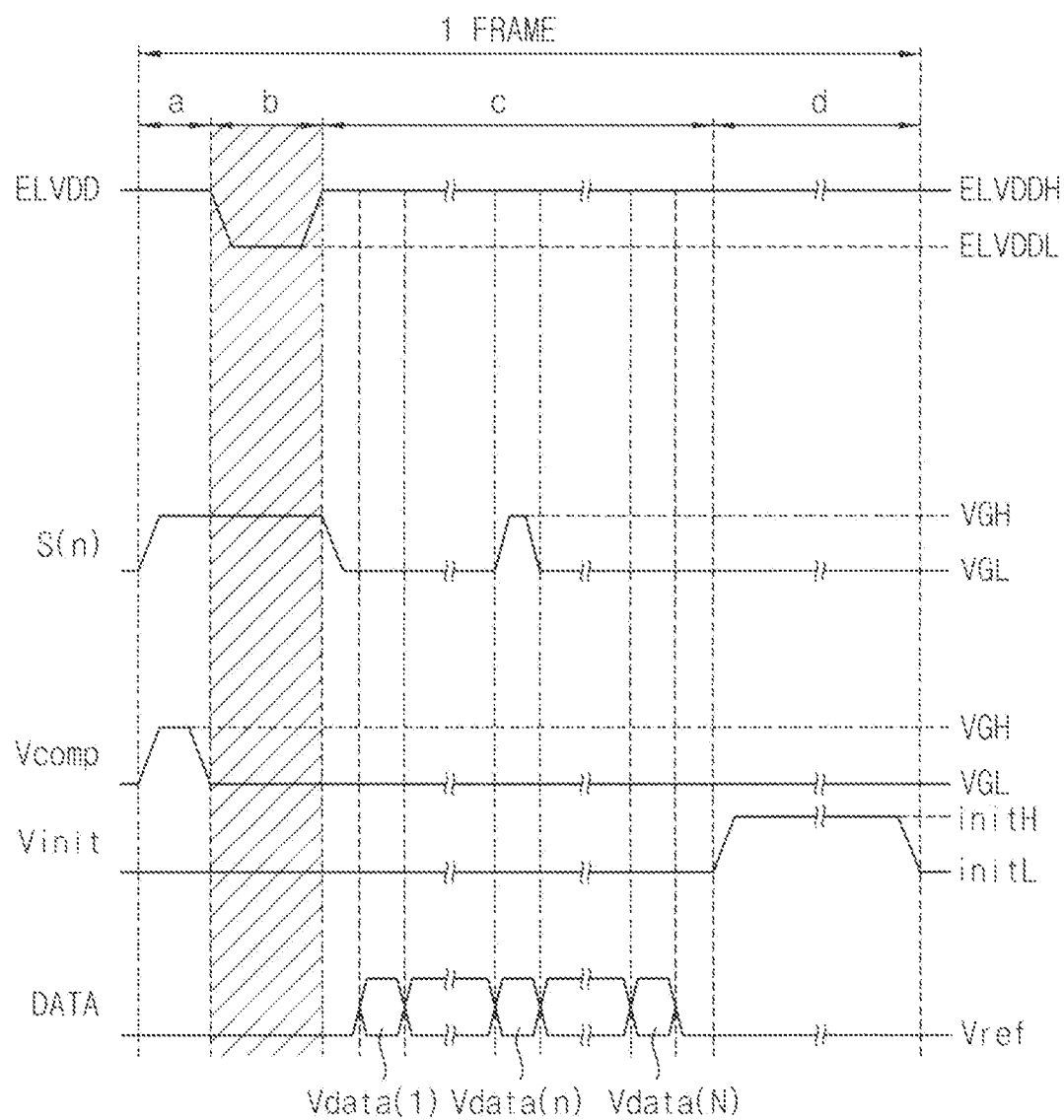

FIGS. 5A and 5B are conceptual diagrams illustrating a method of driving the pixel circuit according to an exemplary embodiment.

Referring to FIGS. 5A and 5B, the second period 'b' may correspond to a compensating period during which the threshold voltage of the first transistor T1 is compensated.

In the second period 'b', the low voltage initL of the first driving signal Vinit is applied to the first voltage line VL1, the low voltage VGL of the second driving signal Vcomp is applied to the third voltage line VL3, the low voltage ELVDDL of the first power source signal ELVDD is applied to the second voltage line VL2. The n-th scan line SLn receives the high voltage VGH of the n-th scan signal S(n). The m-th data line receives the reference voltage Vref.

The second transistor T2 is turned on in response to the high voltage VGH of the n-th scan signal S(n). The third transistor T3 is turned off in response to the low voltage VGL of the second driving signal Vcomp.

When the second transistor T2 is turned on, the control electrode CE1 and the second electrode E12 of the first transistor T1 are connected to each other and the low voltage ELVDDL of the first power source signal ELVDD is applied to the first electrode E11 of the first transistor T1.

Because a drain electrode E12 which has a higher voltage than a source electrode E11 is connected to the gate, the transistor is diode-connected.

A voltage applied to the first electrode E11 of the first transistor T1 is determined to be lower than the low voltage initL of the first driving signal Vinit applied to the second electrode E12 and thus, the first electrode E11 may drive as the source and the second electrode E12 may drive as the drain.

Therefore, when the second transistor T2 is turned on, the gate and drain of the first transistor T1 are connected to each other and the first transistor T1 is diode-connected.

When the first transistor T1 is diode-connected, the first node N1 connected to the control electrode CE1 of the first transistor T1 receives a voltage corresponding to a sum voltage of the low voltage ELVDDL of the first power source signal and the threshold voltage Vth,T1 of the first transistor T1.

Therefore, the threshold voltage of the first transistor T1 may be compensated.

According to the exemplary embodiment, a length of the second period 'b' may be freely adjusted in the frame period and thus a sufficient compensating period may be obtained.

Figure 6A:
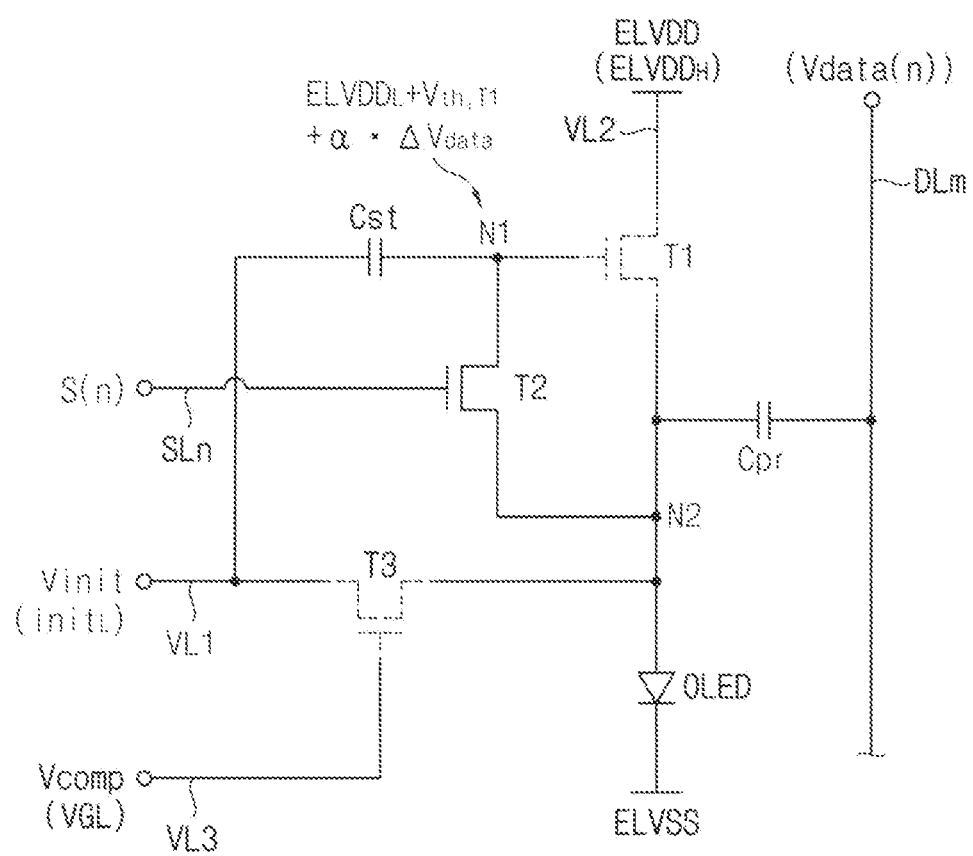
FIGS. 6A and 6B are conceptual diagrams illustrating a method of driving the pixel circuit according to an exemplary embodiment.
Figure 6B:
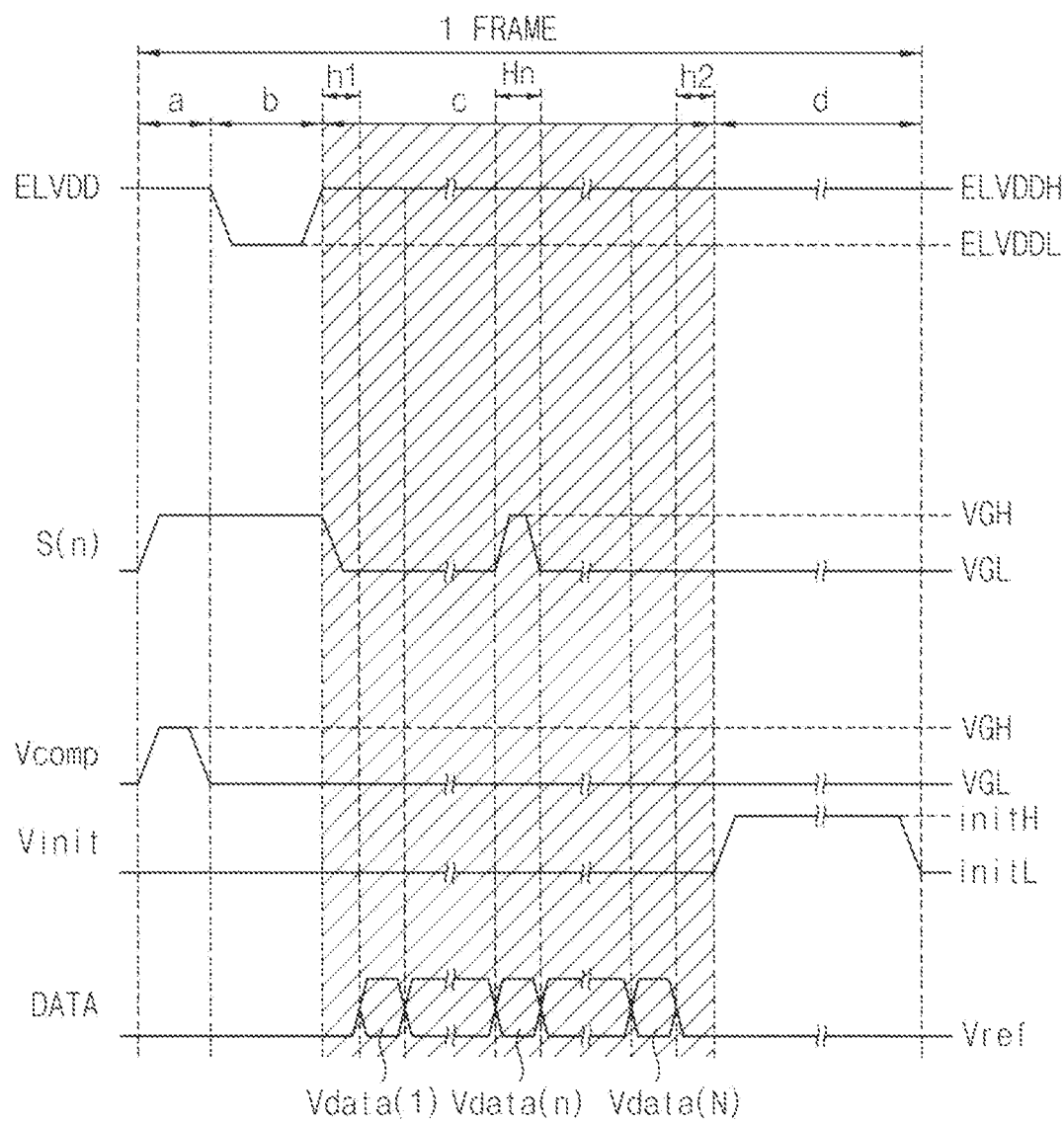

FIGS. 6A and 6B are conceptual diagrams illustrating a method of driving the pixel circuit according to an exemplary embodiment.

Referring to FIGS. 6A and 6B, the third period 'c' may correspond to a data-programming period during which the data voltage is applied to the plurality of pixels.

In the third period 'c', the low voltage initL of the first driving signal Vinit is applied to the first voltage line VL1, the low voltage VGL of the second driving signal Vcomp is applied to the third voltage line VL3, and the high voltage ELVDDH of the first power source signal ELVDD is applied to the second voltage line VL2. The n-th scan line SLn receives a high voltage VGH of an n-th scan signal S(n) during an n-th horizontal period Hn of the third period 'c'. The m-th data line DLm receives an n-th data voltage Vdata(n) of an n-th horizontal line corresponding to the n-th horizontal period Hn during the n-th horizontal period Hn.

Referring to the method of driving the pixel circuit PC1, the first transistor T1 which has the control electrode CE1 connected to the first node N1 is turned off because VGS of the first transistor T1 is less than the threshold voltage Vth,T1. The first node N1 receives a voltage (ELVDD$_L$+Vth,T1+α∆Vdata) corresponding to a sum voltage of the low voltage ELVDD$_L$ of the first power source signal ELVDD, the threshold voltage Vth,T1 of the first transistor T1 and a divided voltage α∆Vdata. The third transistor T3 is turned off in response to the low voltage VGL of the second driving signal Vcomp.

The second transistor T2 is turned on in response to the high voltage VGH of the n-th scan signal S(n), and then the first node N1 is connected to the second node N2. The first capacitor Cst and the second capacitor Cpr are connected to the first node N1 in series by the turned-on second transistor T2.

The n-th data voltage Vdata(n) corresponding to the pixel circuit PC1 is applied to the m-th data line DLm. The m-th data line DLm receives a difference voltage ∆Vdata between the n-th data voltage Vdata(n) and the reference voltage Vref.

The first and second capacitors Cst and Cpr which are connected to the first node N1 in series has a voltage division ratio α corresponding to the first node N1. The voltage division ratio α and the difference voltage ∆Vdata may be defined as the following Equation 2.

$$\alpha = \frac{C_{pr}}{C_{st} + C_{pr}} \quad \text{Equation 2}$$

$$\Delta V_{data} = V_{data(n)} - V_{ref}$$

Therefore, the difference voltage ∆Vdata is divided by the voltage division ratio α of the first and second capacitors Cst and Cpr and divided voltage α∆Vdata corresponding to the n-th data voltage Vdata(n) is applied to the first node N1.

Therefore, a voltage defined as the following Equation 3 may be applied to the first node N1 during the n-th horizontal period Hn.

$$\text{ELVDD}_L + V_{th,T1} + \alpha \cdot \Delta V_{data} \quad \text{Equation 3}$$

According to the exemplary embodiment, the third period 'c' may include a first holding period h1 corresponding to an early period of the third period 'c' and a second holding period h2 corresponding to a late period of the third period 'c'.

The first holding period h1 may correspond to a period which is before a first horizontal period in which a data voltage Vdata(1) of a first horizontal line is applied to the plurality of data lines DL1, ..., DLm, ..., DLM. During the first holding period h1, the reference voltage Vref is applied to the plurality of data lines DL1, ..., DLm, ..., DLM and thus, the plurality of data lines DL1, ..., DLm, ..., DLM may hold the reference voltage Vref before the first horizontal period.

The second holding period h2 may correspond to a period which is after an N-th horizontal period in which the data voltage Vdata(N) of an N-th horizontal line, that is a last horizontal line, is applied to the plurality of data lines DL1, ..., DLm, ..., DLM. During the second holding period h2, the reference voltage Vref is applied to the plurality of data lines DL1, ..., DLm, ..., DLM and thus, the plurality of data lines DL1, ..., DLm, ..., DLM may hold the reference voltage Vref after the N-th horizontal period.

Figure 7A:
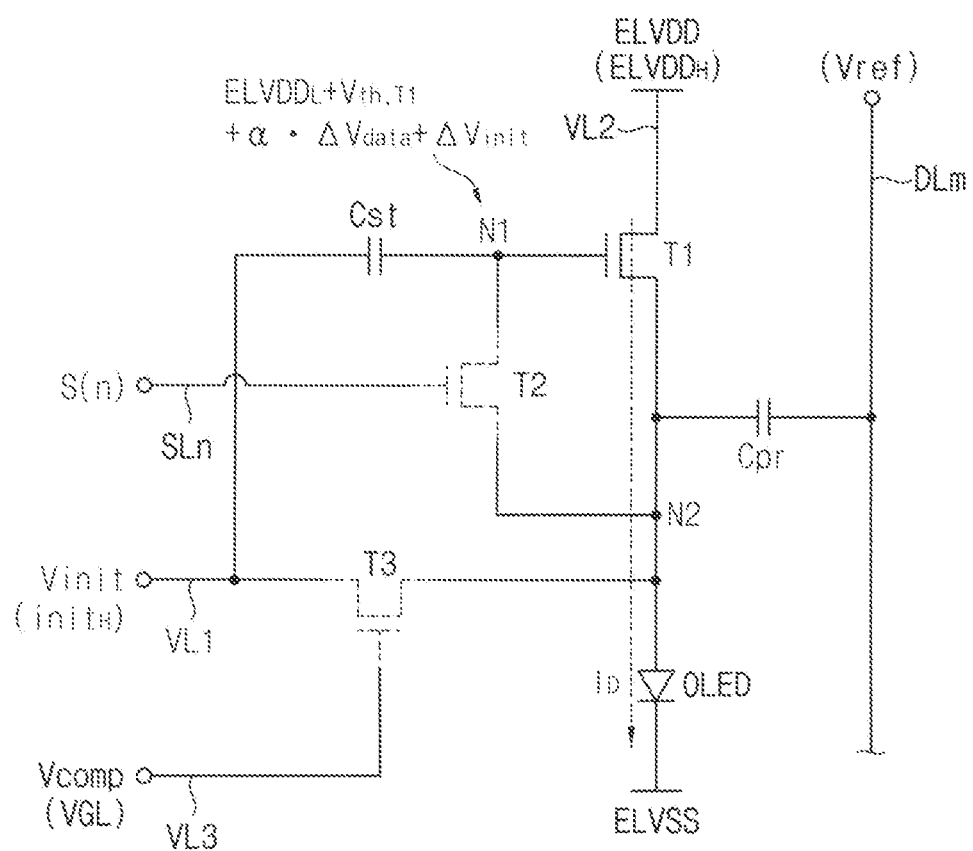

FIGS. 7A and 7B are conceptual diagrams illustrating a method of driving the pixel circuit according to an exemplary embodiment.

Referring to FIGS. 7A and 7B, the fourth period 'd' may correspond to a light-emitting period during which the organic light emitting diode OLED emits the light.

Referring to the fourth period 'd', the high voltage initH of the first driving signal Vinit is applied to the first voltage line VL1, the low voltage VGL of the second driving signal Vcomp is applied to the third voltage line VL3, and the high voltage ELVDDH of the first power source signal ELVDD is applied to the second voltage line VL2. The n-th scan line SLn receives the low voltage VGL of the n-th scan signal S(n). The m-th data line DLm receives the reference voltage Vref.

Referring to the method of driving the pixel circuit PC1, the high voltage initH of the first driving signal Vinit is applied to the first node N1 and thus, a voltage defined as the following Equation 4 may be applied to the first node N1.

$$\text{ELVDD}_L + V_{th,T1} + \alpha \cdot \Delta V_{data} + \Delta V_{init} \qquad \text{Equation 4}$$

In Equation 4, a difference voltage ΔVinit represents a difference voltage between the high and low voltages initH and initL of the first driving signal Vinit.

When the voltage defined as the following Equation 4 is applied to the control electrode CE1 of the first transistor T1, the first transistor T1 is turned on based on the difference voltage ΔVinit.

The second transistor T2 is turned off in response to the low voltage VGL of the n-th scan signal S(n) and the third transistor T3 is turned off in response to the low voltage VGL of the second driving signal Vcomp.

Therefore, the first transistor T1 is turned on and thus, a driving current ID corresponding to the data voltage may flow through the organic light emitting diode OLED. The organic light emitting diode OLED may emit the light.

According to the exemplary embodiment, the pixel circuit may include only three transistors and two capacitors and thus, an ultra high definition display may be easily designed using the pixel circuit. In addition, the length of the compensating period in the frame period may be freely controlled and thus, a sufficient compensation period is obtained. In addition, whether the organic light emitting diode emits or not the light may be controlled by adjusting a level of the first power source signal ELVDD.

Figure 8:
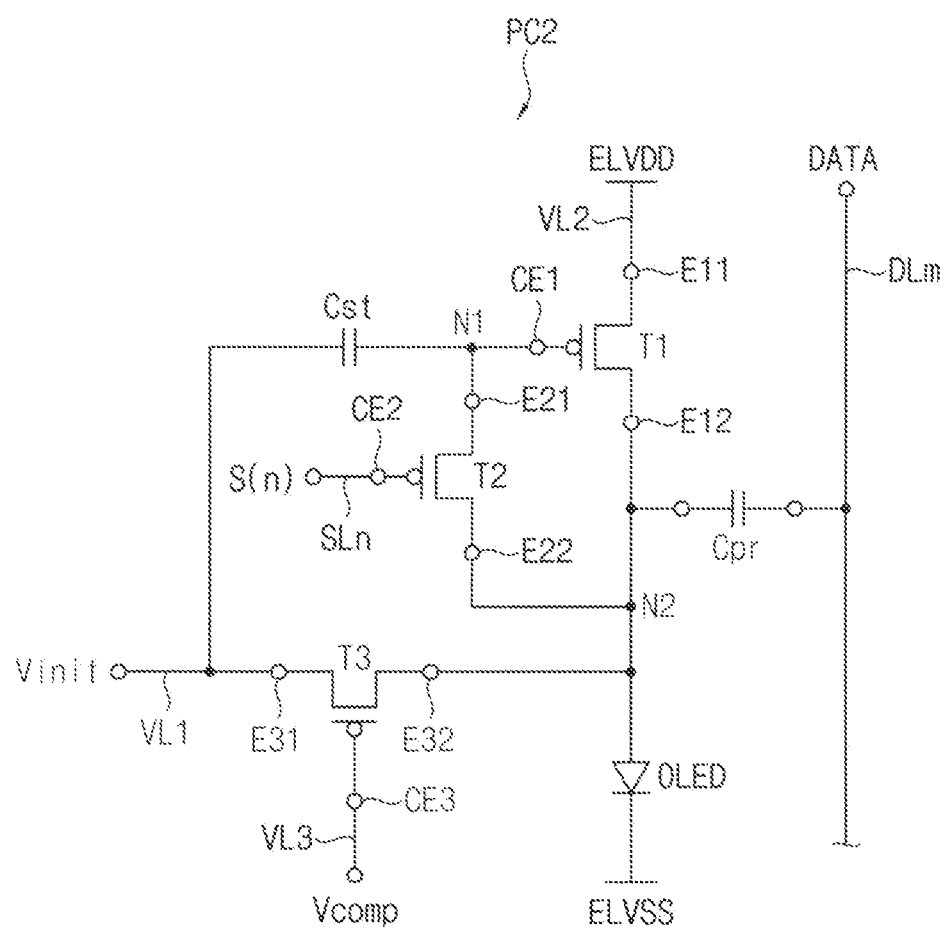
FIG. 8 is a circuit diagram illustrating a pixel circuit according to an exemplary embodiment.

FIG. 8 is a circuit diagram illustrating a pixel circuit according to an exemplary embodiment.

Referring to FIG. 8, the pixel circuit PC2 may include a first transistor T1, a second transistor T2, a third transistor T3, a first capacitor Cst, a second capacitor Cpr and an organic light emitting diode OLED.

The pixel circuit PC2 may include three transistors and two capacitors as the pixel circuit PC1 described in the previous exemplary. However, each of the first, second and third transistors T1, T2 and T3 according to the exemplary embodiment may be a P-type transistor. The P-type transistor is turned on when a control electrode of the P-type transistor receives a low voltage and is turned off when the control electrode of the P-type transistor receives a high voltage. According to the exemplary embodiment, the low voltage may be a turn-on voltage of the transistor and the high voltage may be a turn-off voltage of the transistor.

Hereinafter, the same reference numerals are used to refer to the same or like parts as those described in the previous exemplary embodiments, and the same detailed explanations are not repeated unless necessary.

The first transistor T1 may include a control electrode CE1 connected to a first node N1, a first electrode E11 connected to a second voltage line VL2 and a second electrode E12 connected to a second node N2. The second voltage line VL2 is configured to receive the first power source signal ELVDD.

The first power source signal ELVDD may have a high voltage which is a voltage of a normal positive power source signal and a low voltage which is a predetermined low voltage for driving the pixel circuit PC2.

The second transistor T2 may include a control electrode CE2 connected to the n-th scan line SLn, a first electrode E21 connected to the first node N1 and a second electrode E22 connected to the second node N2. The n-th scan line SLn is configured to receive an n-th scan signal S(n). The n-th scan signal S(n) may have a low voltage which turns on the second transistor T2 and a high voltage which turns off the second transistor T2.

The third transistor T3 may include a control electrode CE3 connected to the third voltage line VL3, a first electrode E31 connected to the first voltage line VL1 and a second electrode E32 connected to the second node N2. The first voltage line VL1 is configured to receive a first driving signal Vinit and the third voltage line VL3 is configured to receive a second driving signal Vcomp.

The first driving signal Vinit may have high and low voltages which are predetermined high and low voltages for driving the pixel circuit PC2.

The second driving signal Vcomp may have a low voltage which turns on the third transistor T3 and a high voltage which turns off the third transistor T3. For example, the high and low voltages of the second driving signal Vcomp may be equal to those of the n-th scan signal S(n), respectively.

The first capacitor Cst may be connected between the first voltage line VL1 and the first node N1. The first capacitor Cst may store a node voltage applied to the first node N1.

The second capacitor Cpr may be connected between the second node N2 and m-th data line DLm. The second capacitor Cpr may store the data voltage applied to the m-th data line DLm.

The first and second capacitors Cst and Cpr may be connected to the first node in series N1 through the second transistor T2. The data voltage applied to the m-th data line DLm may be divided by a voltage division ratio of the first and second capacitors Cst and Cpr and then, divided data voltage may be applied to the first node N1.

The organic light emitting diode OLED may include an anode electrode connected to the second node N2 and a cathode electrode which receives the second power source signal ELVSS. The second power source signal ELVSS may have a low voltage of a normal negative power source signal.

When the transistor T1 is turned on, a driving current corresponding to the data voltage of the first node N1 may flow through the organic light emitting diode OLED and thus, the organic light emitting diode OLED may emit the light.

Figure 9:
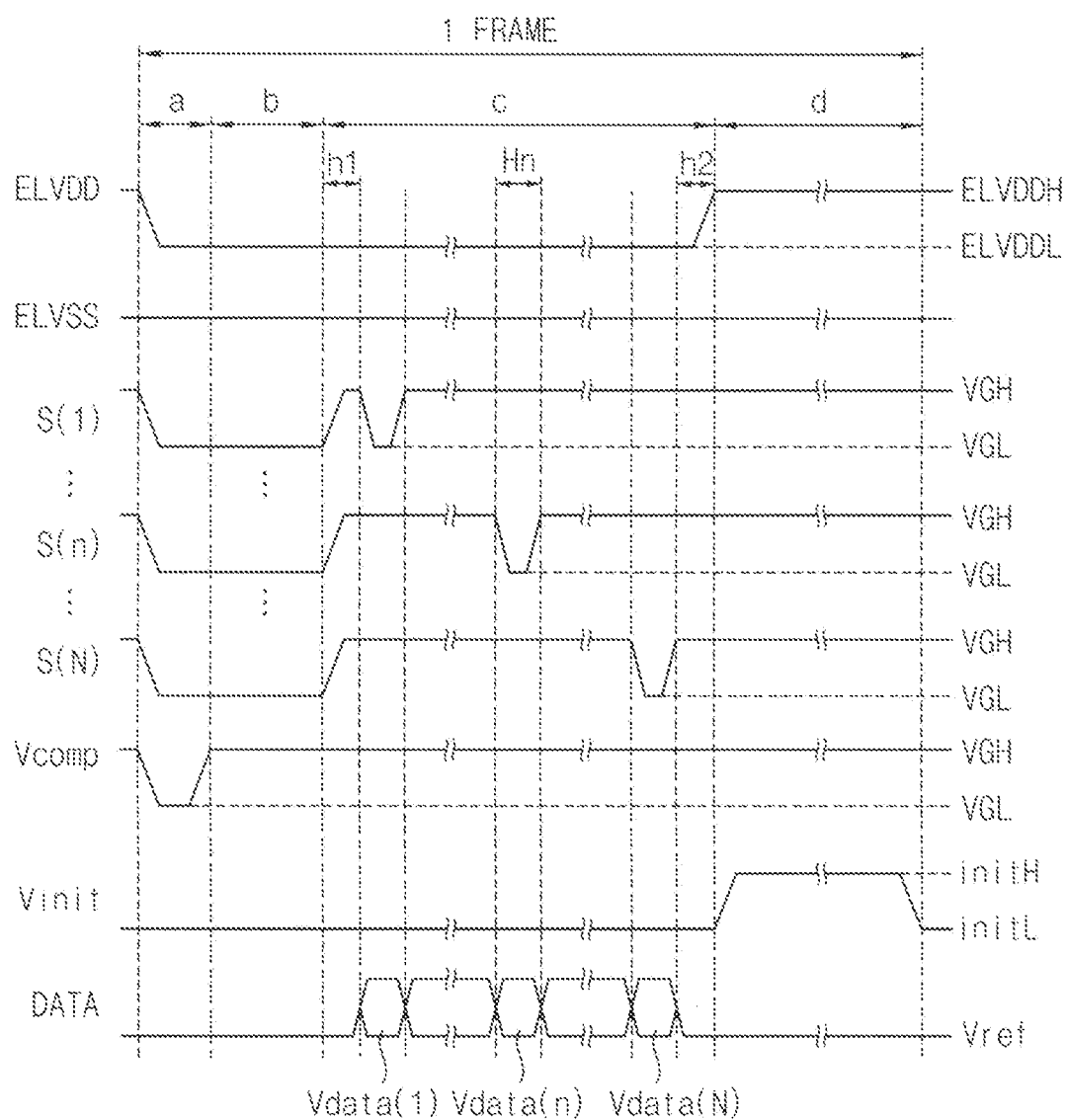
FIG. 9 is a timing chart illustrating a plurality of input signals of a display apparatus according to an exemplary embodiment.

FIG. 9 is a timing chart illustrating a plurality of input signals of a display apparatus according to an exemplary embodiment.

Referring to FIGS. 8 and 9, the frame period may include a first period 'a' during which the anode electrode of the organic light emitting diode OLED is initialized, a second period 'b' during which the threshold voltage of the first transistor T1 is compensated, a third period 'c' during which the data voltage is programmed and a fourth period 'd' during which the organic light emitting diode OLED emit the light.

Referring to the first period 'a', a first voltage line VL1 receives a low voltage initL of the first driving signal Vinit. The third voltage line VL3 may receive a low voltage VGL of the second driving signal Vcomp. The second voltage line VL2 may receive a low voltage ELVDDL of the first power source signal ELVDD. The cathode electrode of the organic light emitting diode OLED may receive a second power source signal ELVSS.

The low voltage initL of the first driving signal Vinit and the second power source signal ELVSS may be defined as the following Equation 5.

$$\text{ELVSS} > \text{ELVDD}_L > \text{init}_L \qquad \text{Equation 5}$$

For example, the low voltage initL of the first driving signal Vinit may be about −6 V, the low voltage ELVDDL of the first power source signal ELVDD may be about −2 V, and the second power source signal ELVSS may be about 0 V.

The plurality of scan lines SL1, . . . , SLn, . . . , SLN may simultaneously receive the low voltages VGL of the plurality of scan signals S(1), . . . , S(n), . . . S(N). Thus, an n-th scan line SLn receives the low voltage VGL of an n-th scan signal S(n). For example, the low voltage VGL of the scan signal may be about −10 V.

The plurality of data lines DL1, . . . , DLm, . . . , DLM may receive a reference voltage Vref. The reference voltage Vref may be equal to or lower than a lowest voltage in a voltage range of the data voltage. For example, when the voltage range of the data voltage is about 1.5 V to about 4.5 V, the reference voltage Vref may be equal to or lower than about 1.5 V.

Referring to a method of driving the pixel circuit PC2 in the first period 'a', the low voltage initL of the first driving signal Vinit is applied to the first node N1. The first transistor T1 is turned on in response to the low voltage initL of the first driving signal Vinit applied to the first node N1. The second transistor T2 is turned on in response to the low voltage VGL of the n-th scan signal S(n). The anode electrode of the organic light emitting diode OLED connected to the second node N2 may be initialized by the low voltage initL of the first driving signal Vinit.

The low voltage ELVDDL of the first power source signal ELVDD may be higher than the low voltage initL of the first driving signal Vinit. The low voltage ELVDDL of the first power source signal ELVDD is applied to the second node N2 through the turned-on first transistor T1.

During the first period 'a', the anode electrodes of the organic light emitting diodes OLED in all pixels may be initialized by the low voltage initL of the first driving signal Vinit, simultaneously.

Referring to the second period 'b', the first voltage line VL1 is configured to receive the low voltage initL of the first driving signal Vinit, the third voltage line VL3 is configured to receive the high voltage VGH of second driving signal Vcomp, and the second voltage line VL2 is configured to receive a low voltage ELVDDL of the first power source signal ELVDD. The cathode electrode of the organic light emitting diode OLED is configured to receive the second power source signal ELVSS.

The plurality of scan lines SL1, . . . , SLn, . . . , SLN is configured to simultaneously receive low voltages VGL of the plurality of scan signals S(1), . . . , S(n), . . . S(N) as the first period 'a'.

The plurality of data lines DL1, . . . , DLm, . . . , DLM is configured to receive the reference voltage Vref as the first period 'a'.

Referring to the method of driving the pixel circuit PC2 in the second period 'b', the second transistor T2 is turned on in response to the low voltage VGL of the n-th scan signal S(n). The third transistor T3 is turned off in response to the high voltage VGH of the second driving signal Vcomp.

The control electrode CE1 and the second electrode E12 of the first transistor T1 are connected to each other through the turned-on second transistor T2. The first transistor T1 of the P-type transistor includes the first electrode E11 receiving the low voltage EVDDL of the first power source signal ELVDD and the second electrode E12 receiving the low voltage initL of the first driving signal. Thus, the first electrode E11 of the first transistor T1 may drive as the source and the second electrode E12 may drive as the drain. Therefore, the gate and the drain of the first transistor T1 may be connected through the turned-on second transistor T2 and thus, the first transistor T1 may be diode-connected. The first node N1 connected to the control electrode CE1 of the first transistor T1 receives a voltage corresponding to a difference voltage between the low voltage ELVDDL of the first power source signal and the threshold voltage Vth,T1 of the first transistor T1. When the first transistor T1 is the P-type transistor, the threshold voltage of the first transistor T1 may be a negative voltage. Hereinafter, the threshold voltage of the first transistor T1 being the P-type transistor may be an absolute value of the threshold voltage being the negative number.

Therefore, the threshold voltages of the first transistors T1 in all pixels may be simultaneously compensated using the difference voltage between the low voltage ELVDDL of the first power source signal ELVDD and the threshold voltage Vth,T1 of corresponding first transistor T1.

Referring to the third period 'c', the first voltage line VL1 is configured to receive the low voltage initL of the first driving signal Vinit, the third voltage line VL3 is configured to receive the high voltage VGH of the second driving signal Vcomp, and the second voltage line VL2 is configured to receive the low voltage ELVDDL of the first power source signal ELVDD. The cathode electrode of the organic light emitting diode OLED is configured to receive the second power source signal ELVSS.

The plurality of scan lines SL1, . . . , SLn, . . . , SLN is configured to sequentially receive low voltages VGL of the plurality of scan signals S(1), . . . , S(n), . . . S(N). The plurality of data lines DL1, . . . , DLm, . . . , DLM is configured to receive the data voltage DATA corresponding to the plurality of horizontal lines in synchronization with the low voltages VGL of the plurality of scan signals S(1), ..., S(n), ... S(N).

Therefore, the n-th scan line SLn receives the low voltage VGL of an n-th scan signal S(n) during an n-th horizontal period Hn of the third period 'c'. The m-th data line DLm receives an n-th data voltage Vdata(n) of an n-th horizontal line corresponding to the n-th horizontal period Hn during the n-th horizontal period Hn.

Referring to the method of driving the pixel circuit PC2 in the third period 'c', the low voltage ELVDDL of the first power source signal ELVDD is applied to the first electrode E11 of the first transistor T1, and a voltage corresponding to the n-th data voltage Vdata(n) is applied to the second electrode E12 of the first transistor T1. A high voltage higher than a voltage of the first electrode E11 of the first transistor T1 is applied to the second electrode E12 of the first transistor T1 and thus, a current may not flow through the first transistor T1.

The second transistor T2 is turned on in response to the low voltage VGL of the n-th scan signal S(n), and then the first node N1 is connected to the second node N2. The first capacitor Cst and the second capacitor Cpr are connected to the first node N1 in series through the turned-on second transistor T2.

The first transistor T1 which has the control electrode CE1 connected to the first node N1 is turned off. The first node N1 receives a voltage corresponding to a difference voltage between the low voltage $ELVDD_L$ of the first power source signal ELVDD and the threshold voltage Vth,T1 of the first transistor T1.

The third transistor T3 is turned off in response to the high voltage VGH of the second driving signal Vcomp.

The n-th data voltage Vdata(n) corresponding to the pixel circuit PC2 is applied to the m-th data line DLm. The m-th data line DLm receives a difference voltage ($\Delta$Vdata=Vdata(n)−Vref) between the n-th data voltage Vdata(n) and the reference voltage Vref.

The first and second capacitors Cst and Cpr which are connected to the first node N1 in series has a voltage division ratio $\alpha$ corresponding to the first node N1.

The difference voltage $\Delta$Vdata is divided by the voltage division ratio $\alpha$ of the first and second capacitors Cst and Cpr and the divided voltage $\alpha \cdot \Delta$Vdata corresponding to the n-th data voltage Vdata(n) is applied to the first node N1.

Therefore, a voltage defined as the following Equation 6 may be applied to the first node N1 during the n-th horizontal period Hn.

$$ELVDD_L - V_{th,T1} + \alpha \cdot \Delta V_{data} \qquad \text{Equation 6}$$

According to the exemplary embodiment, the third period 'c' may include a first holding period h1 corresponding to an early period of the third period 'c' and a second holding period h2 corresponding to a late period of the third period 'c'.

The first holding period h1 may correspond to a period which is before a first horizontal period in which the data voltage Vdata(1) of a first horizontal line is applied to the plurality of data lines DL1, ..., DLm, ..., DLM. During the first holding period h1, the reference voltage Vref is applied to the plurality of data lines DL1, ..., DLm, ..., DLM and thus, the plurality of data lines DL1, ..., DLm, ..., DLM may hold the reference voltage Vref before the first horizontal period.

The second holding period h2 may correspond to a period which is after an N-th horizontal period in which the data voltage Vdata(N) of an N-th horizontal line, that is a last horizontal line, is applied to the plurality of data lines DL1, ..., DLm, ..., DLM. During the second holding period h2, the reference voltage Vref is applied to the plurality of data lines DL1, ..., DLm, ..., DLM and thus, the plurality of data lines DL1, ..., DLm, ..., DLM may hold the reference voltage Vref after the N-th horizontal period.

Referring to the fourth period 'c1', the high voltage initH of the first driving signal Vinit is applied to the first voltage line VL1. The high voltage initH of the first driving signal Vinit may be determined to a predetermined voltage for turning on the first transistor T1. For example, the high voltage initH of the first driving signal Vinit may be about 2.5 V.

The third voltage line VL3 is configured to receive the high voltage VGH of the second driving signal Vcomp.

The second voltage line VL2 is configured to receive the high voltage ELVDDH of the first power source signal ELVDD. For example, the high voltage ELVDDH of the first power source signal ELVDD may be about 7 V.

The cathode electrode of the organic light emitting diode OLED is configured to receive the second power source signal ELVSS.

The plurality of scan lines SL1, ..., SLn, SLN is configured to simultaneously receive high voltages VGH of the plurality of scan signals S(1), ..., S(n), ... S(N).

The plurality of data lines DL1, ..., DLm, DLM is configured to simultaneously receive the reference voltage Vref.

Referring to the method of driving the pixel circuit PC2 in the fourth period the first node N1 may have a node voltage as the following Equation 7.

$$ELVDD_L - V_{th,T1} + \alpha \cdot \Delta V_{data} + \Delta V_{init} \qquad \text{Equation 7}$$

In Equation 7, the difference voltage $\Delta$Vinit represents a difference voltage between the high and low voltages initH and initL of the first driving signal Vinit.

When the node voltage defined as the following Equation 7 is applied to the control electrode CE1 of the first transistor T1, the first transistor T1 is turned on based on the difference voltage $\Delta$Vinit. Then, the high voltage $ELVDD_H$ of the first power source signal ELVDD is applied to the first electrode E11 of the first transistor T1 and thus, a driving current corresponding to the data voltage applied to the first node N, may flow through the organic light emitting diode OLED.

The second transistor T2 is turned off in response to the high voltage VGH of the n-th scan signal S(n) and the third transistor T3 is turned off in response to the high voltage VGH of the second driving signal Vcomp.

Therefore, during the fourth period driving currents corresponding to data voltages applied to the plurality of pixels, may flow through organic light emitting diodes OLEDs in the plurality of pixels and thus, the organic light emitting diodes OLEDs in the plurality of pixels may simultaneously emit the light.

According to the exemplary embodiment, the pixel circuit may include only three transistors and two capacitors and thus, an ultra high definition display may be easily designed using the pixel circuit. In addition, the compensating period in the frame period may be freely controlled and thus, sufficiently obtained. In addition, whether the organic light emitting diode emits or not the light may be controlled by adjusting a level of the first power source signal.

Figure 10:
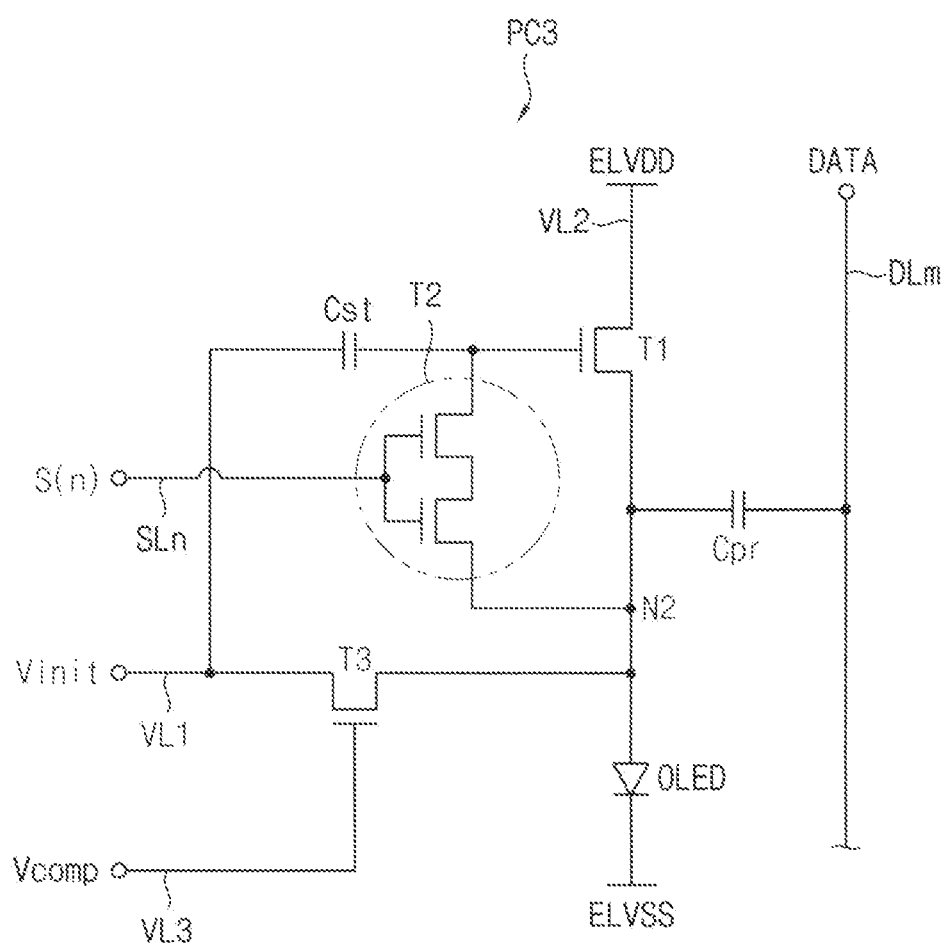
FIGS. 10, 11 and 12 are circuit diagrams illustrating pixel circuits according to exemplary embodiments.
Figure 11:
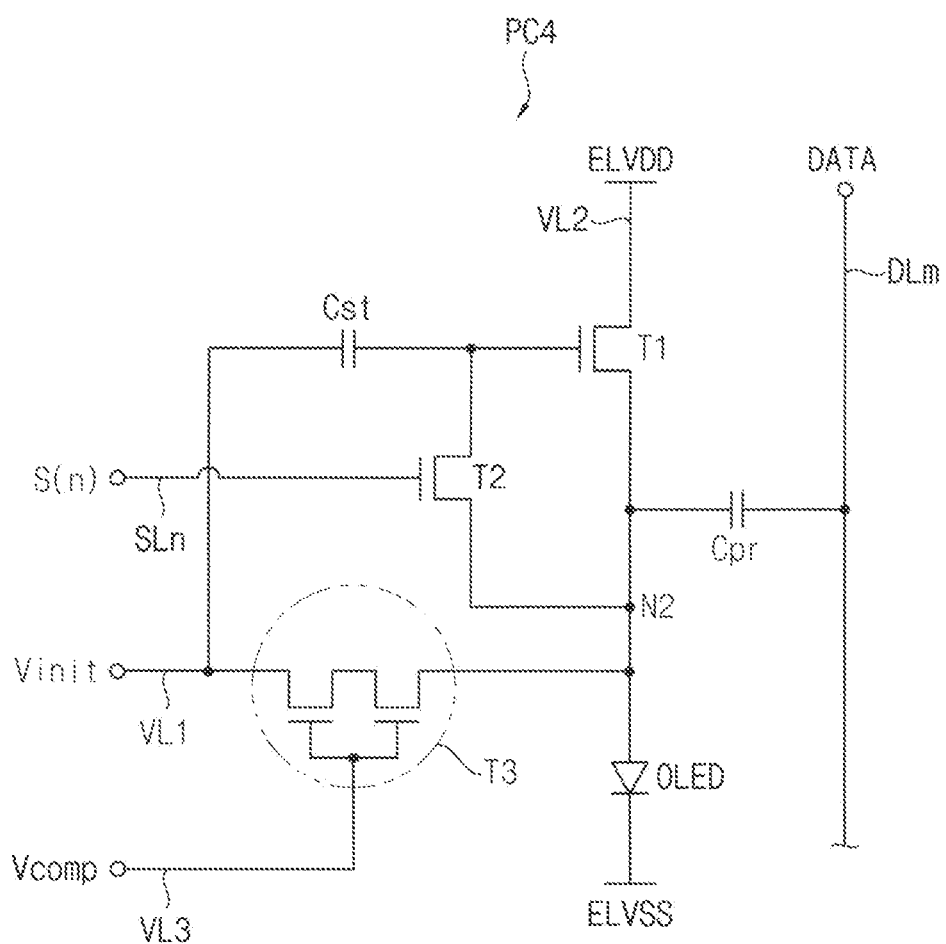
Figure 12:
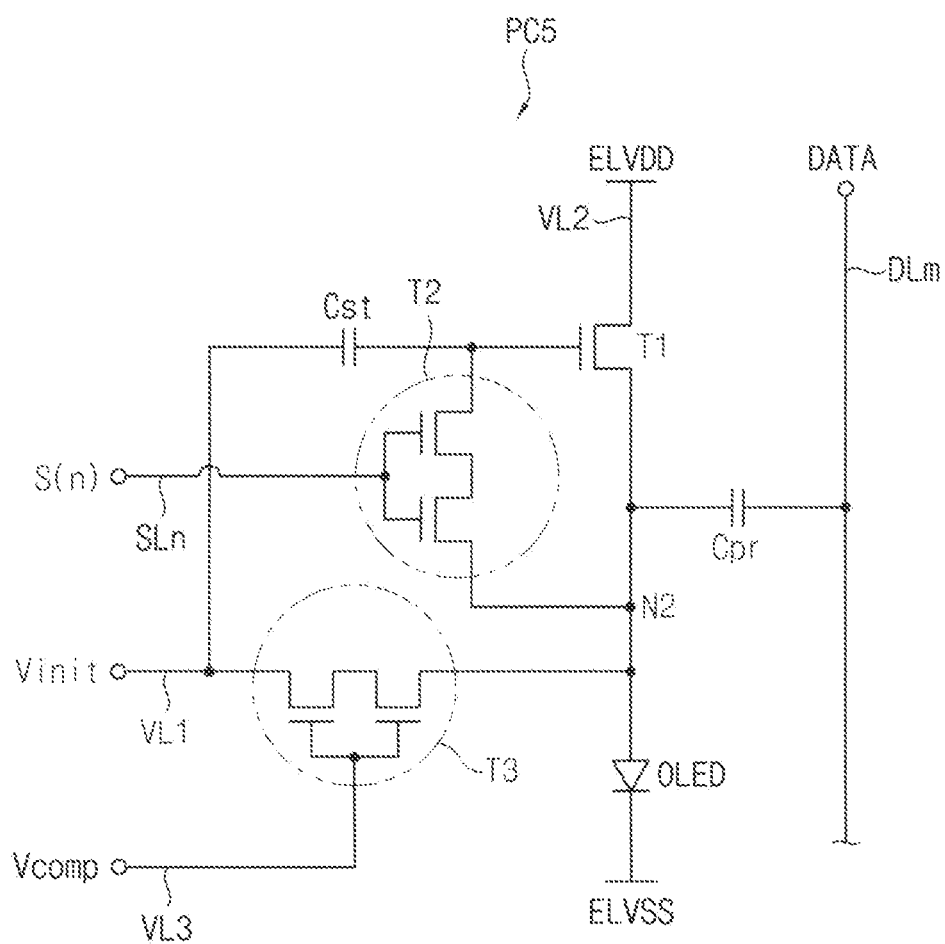

FIGS. 10 to 12 are circuit diagrams illustrating pixel circuits according to exemplary embodiments.

Referring to FIG. 10, a pixel circuit PC3 may include a first transistor T1, a second transistor T2, a third transistor T3, a first capacitor Cst, a second capacitor Cpr and an organic light emitting diode OLED. According to the exemplary embodiment, the second transistor T2 may have a dual gate structure to avoid a leakage current.

Each of the first, second and third transistors T1, T2 and T3 in the pixel circuit PC3 may be an N-type transistor. The pixel circuit PC3 having the N-type transistor may drive as the pixel circuit PC1 described in the previous exemplary referring to FIGS. 2 and 3.

Alternatively, each of the first, second and third transistors T1, T2 and T3 in the pixel circuit PC3 may be a P-type transistor. The pixel circuit PC3 having the P-type transistor may drive as the pixel circuit PC2 described in the previous exemplary referring to FIGS. 8 and 9.

Referring to FIG. 11, a pixel circuit PC4 may include a first transistor T1, a second transistor T2, a third transistor T3, a first capacitor Cst, a second capacitor Cpr and an organic light emitting diode OLED. According to the exemplary embodiment, the third transistor T3 may have a dual gate structure to avoid a leakage current.

Each of the first, second and third transistors T1, T2 and T3 in the pixel circuit PC4 may be an N-type transistor. The pixel circuit PC4 having the N-type transistor may drive as the pixel circuit PC1 described in the previous exemplary referring to FIGS. 2 and 3.

Alternatively, each of the first, second and third transistors T1, T2 and T3 in the pixel circuit PC4 may be a P-type transistor. The pixel circuit PC4 having the P-type transistor may drive as the pixel circuit PC2 described in the previous exemplary referring to FIGS. 8 and 9.

Referring to FIG. 12, a pixel circuit PC5 may include a first transistor T1, a second transistor T2, a third transistor T3, a first capacitor Cst, a second capacitor Cpr and an organic light emitting diode OLED. According to the exemplary embodiment, the second and third transistors T2 and T3 may have a dual gate structure to avoid a leakage current.

Each of the first, second and third transistors T1, T2 and T3 in the pixel circuit PC5 may be an N-type transistor. The pixel circuit PC5 having the N-type transistor may drive as the pixel circuit PC1 described in the previous exemplary referring to FIGS. 2 and 3.

Alternatively, each of the first, second and third transistors T1, T2 and T3 in the pixel circuit PC5 may be P-type transistor. The pixel circuit PC5 having the P-type transistor may drive as the pixel circuit PC2 described in the previous exemplary referring to FIGS. 8 and 9.

According to the exemplary embodiment, the pixel circuit may include only three transistors and two capacitors and thus, an ultra high definition display may be easily designed using the pixel circuit. In addition, the length of the compensating period in the frame period may be freely controlled and thus, a sufficient compensating period is obtained. In addition, whether the organic light emitting diode emits or not the light may be controlled by adjusting a level of the first power source signal. In addition, the leakage current of the transistor may be avoided.

Figure 13:
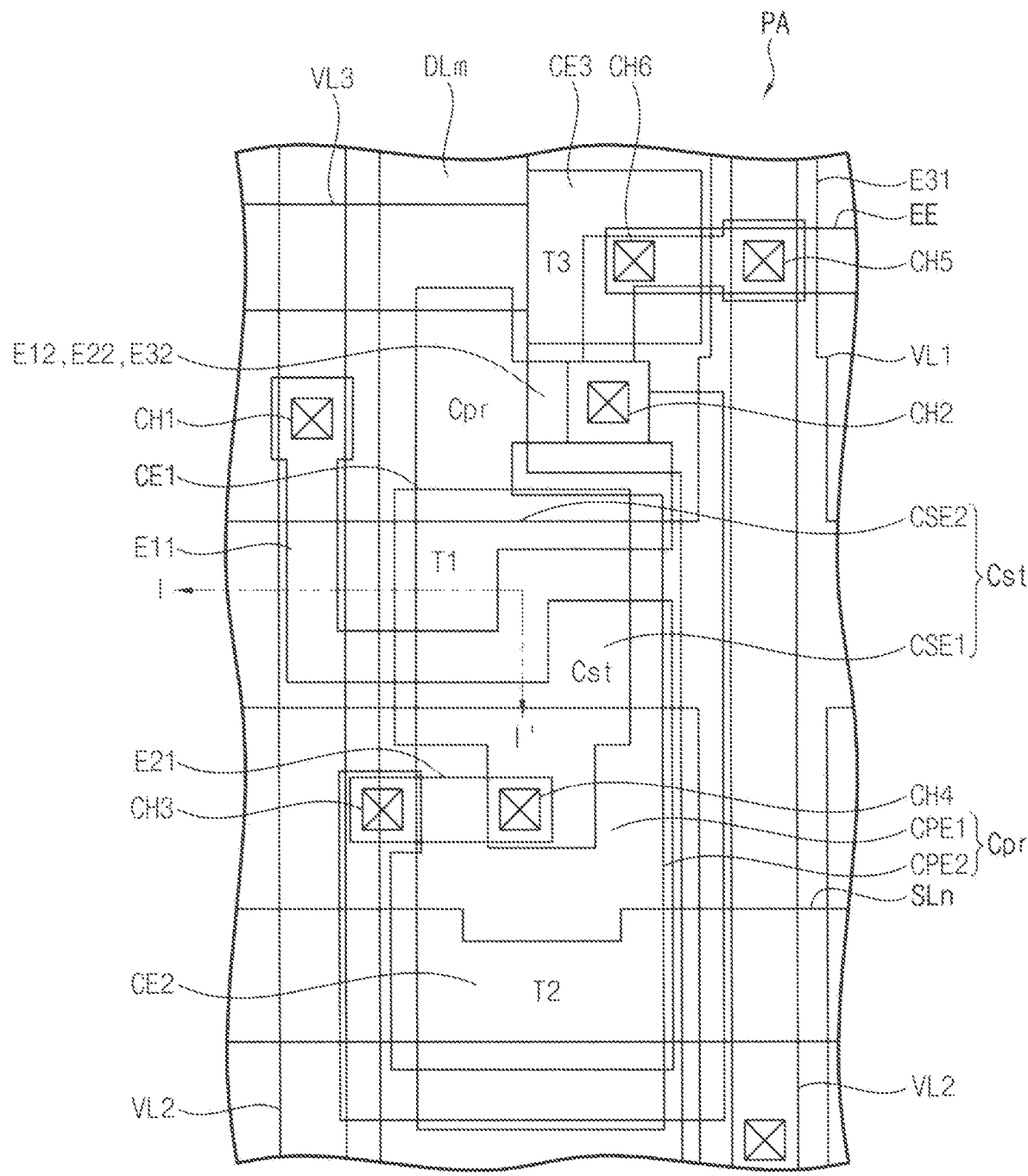
FIG. 13 is a plan view illustrating a display part of a display apparatus according to an exemplary embodiment.

FIG. 13 is a plan view illustrating a display part of a display apparatus according to an exemplary embodiment.

Referring to FIGS. 2 and 13, the pixel circuit may be formed in a pixel circuit area PA. Thus, the first voltage line VL1, the second voltage line VL2, the third voltage line VL3, the n-th scan line SLn, the m-th data line DLm, first transistor T1, the second transistor T2, the third transistor T3, the first capacitor Cst and the second capacitor Cpr may be formed in the pixel circuit area PA.

The first voltage line VL1 may transfer a first driving signal Vinit and extend in the first direction D1.

The second voltage line VL2 may transfer a first power source signal ELVDD and extend in the first direction D1.

The third voltage line VL3 may transfer a second driving signal Vcomp and extend in the second direction D2.

The n-th scan line SLn may transfer an n-th scan signal S(n) and extend in the second direction D2.

The m-th data line DLm may transfer a data voltage and extend in the first direction D1. The m-th data line DLm may be formed across a central area of the pixel circuit area PA.

The first transistor T1 may include a control electrode CE1, a first electrode E11, and a second electrode E12. The control electrode CE1 may have an island shape and be formed in the central area of the pixel circuit area PA. The first electrode E11 may be defined in a portion area of the second voltage line VL2 which is connected to an active pattern ACT through a first contact part CH1. The second electrode E12 may be defined in a portion area of the second capacitor Cpr which is connected to the active pattern ACT through a second contact part CH2.

The second transistor T2 may include a control electrode CE2, a first electrode E21, and a second electrode E22. The control electrode CE2 may be defined in a portion area of the n-th scan line SLn. The first electrode E21 may be defined as an electrode which is connected to the active pattern ACT through a third contact part CH3. The second electrode E22 may be defined in a portion area of the second capacitor Cpr which is connected to the active pattern ACT through the second contact part CH2. The first electrode E21 may be connected to the control electrode CE1 of the first transistor T1 through a fourth contact part CH4.

The third transistor T3 may include a control electrode CE3, a first electrode E31, and a second electrode E32. The control electrode CE3 may be defined in a portion area of the third voltage line VL2. The first electrode E31 may be defined in a portion area of the third voltage line VL3 which is connected to the active pattern ACT through a fifth contact part CH5. The second electrode E32 may be defined in a portion area of the second capacitor Cpr which is connected to the active pattern ACT through the second contact part CH2.

The third voltage line VL3 may be connected to the third voltage line VL3 which is formed in an adjacent pixel circuit area, through a connection line and a sixth contact part CH6.

The first capacitor Cst may be defined in an overlapping area in which an electrode extending in the second direction D2 from the first voltage line VL1 overlaps with the control electrode CE1 of the first transistor T1.

The second capacitor Cpr may be defined in an overlapping area in which an electrode having the island shape in the central area of the pixel circuit area PA overlaps with the m-th data line DLm. The second capacitor Cpr may overlap with the first capacitor Cst.

Figure 14:
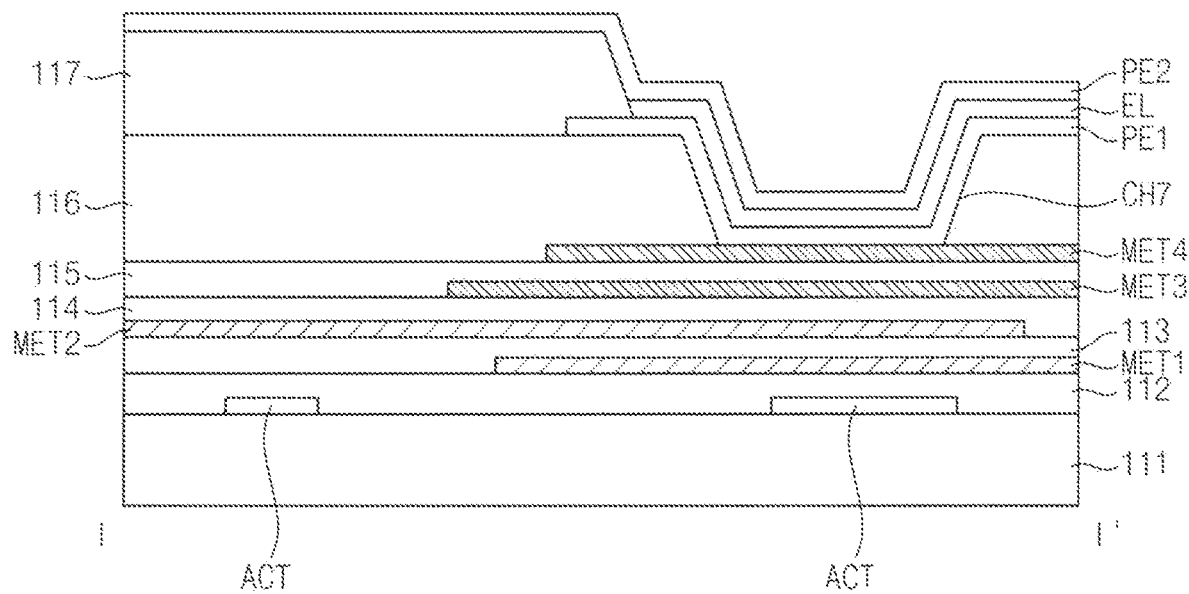
FIG. 14 is a cross-sectional view taken along a line I-I' of FIG. 13.

FIG. 14 is a cross-sectional view taken along a line I-I' of FIG. 13. FIGS. 15 to 19 are plan views illustrating a method of manufacturing of the display part according to an exemplary embodiment.

Figure 15:
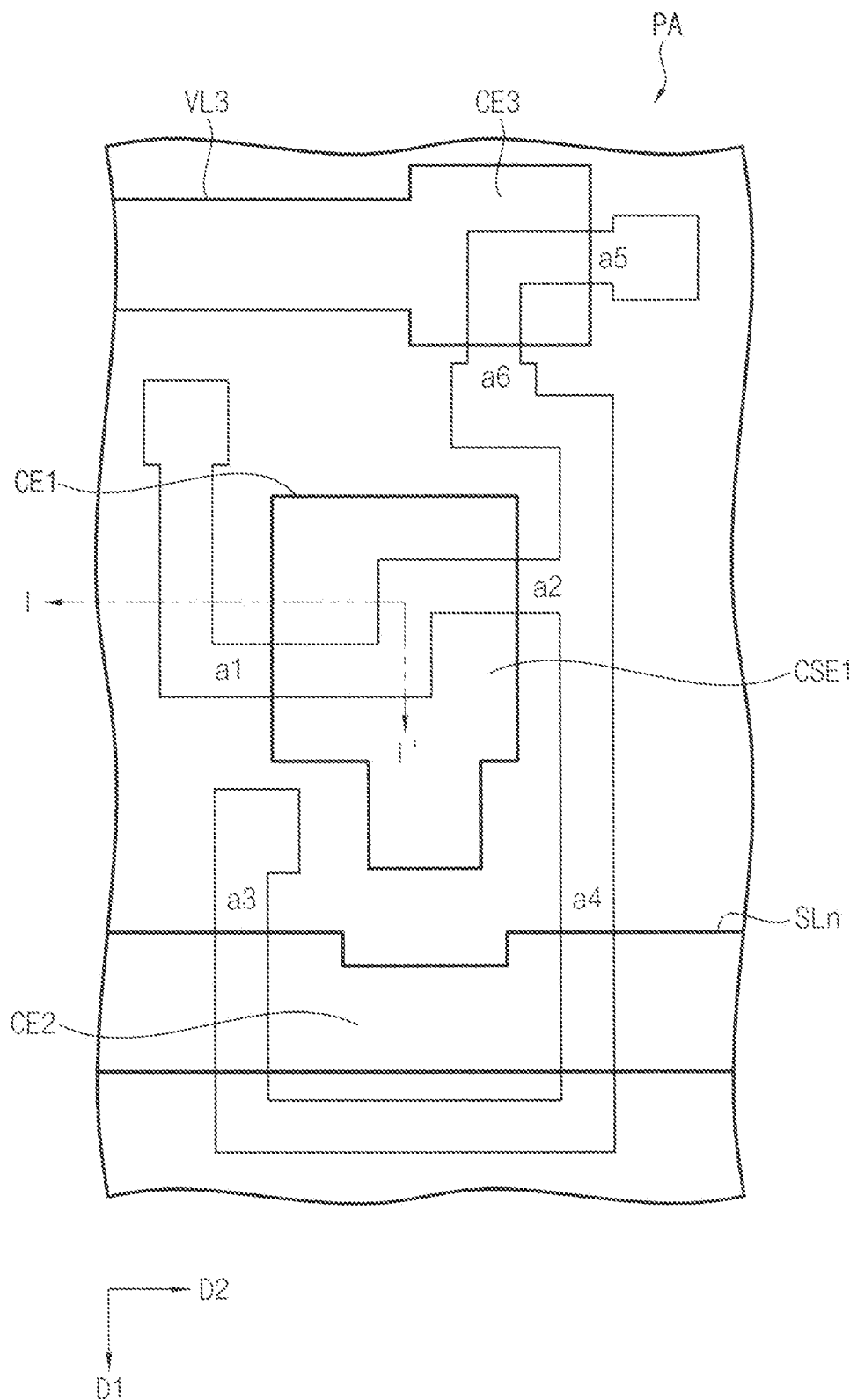
FIGS. 15, 16, 17, 18 and 19 are plan views illustrating a method of manufacturing of the display part according to an exemplary embodiment.

Referring to FIGS. 2, 14 and 15, the display part may include a base substrate 111.

The base substrate 111 may include an insulation material. For example, the base substrate 111 may include a glass, a transparent plastic, a transparent metal oxide, etc.

The active pattern ACT may be disposed on the base substrate 111. The active pattern ACT may include silicon. Alternatively, the active pattern ACT may be formed of a semiconductor oxide including a binary compound (ABx), a ternary compound (ABxCy), a quaternary compound (ABxCyDz), etc. which contain indium, zinc, gallium, tin, titanium, aluminum, hafnium (Hf), zirconium (Zr), magnesium (Mg), etc. These compounds may be used alone or in combination thereof.

The active pattern ACT may include first to sixth areas a1, a2, a3, a4, a5 and a6. The first to sixth areas a1, a2, a3, a4, a5 and a6 may be doped with an impurity, and thus may have electrical conductivity higher than those of other regions of the active pattern ACT. The first to sixth areas a1, a2, a3, a4, a5 and a6 may be first and second electrodes of first, second and third transistors T1, T2 and T3. Boundaries between the first to sixth areas a1, a2, a3, a4, a5 and a6 may not be clearly defined and first to sixth areas a1, a2, a3, a4, a5 and a6 may be electrically connected to each other.

A gate insulating layer 112 may be disposed on the active pattern ACT. The gate insulating layer 112 may include a silicon compound, metal oxide, etc. For example, the gate insulation layer may include silicon oxide, silicon nitride, silicon oxynitride, aluminum oxide, tantalum oxide, hafnium oxide, zirconium oxide, titanium oxide, etc., which may be used alone or in combination thereof. In one embodiment, the gate insulation layer 112 may have a multilayer structure including a silicon oxide layer and silicon nitride layer.

A first conductive pattern MET1 which is patterned from a first conductive layer, may be disposed on the gate insulating layer 112. The first conductive layer may include metal, alloy, metal nitride, conductive metal oxide, transparent conductive material, etc., which may be used alone or in combination thereof.

The first conductive pattern MET1 may include the n-th scan line SLn, the control electrode CE2 of the second transistor T2, the third voltage line VL3, the control electrode CE3 of the third transistor T3, the control electrode CE1 of the first transistor T1, and the first capacitor electrode CSE1 of the first capacitor Cst.

The n-th scan line SLn may extend in the second direction D2.

The control electrode CE2 of the second transistor T2 may be defined in a portion area of the n-th scan line SLn.

The third voltage line VL3 may be disposed in parallel with the n-th scan line SLn.

The control electrode CE3 of the third transistor T3 may be defined in a portion area of the third voltage line VL3.

The control electrode CE1 of the first transistor T1 may have an island shape and be disposed in a central area of the pixel circuit area PA.

The first capacitor electrode CSE1 of the first capacitor Cst may be defined in a portion area of the control electrode CE1.

Figure 16:
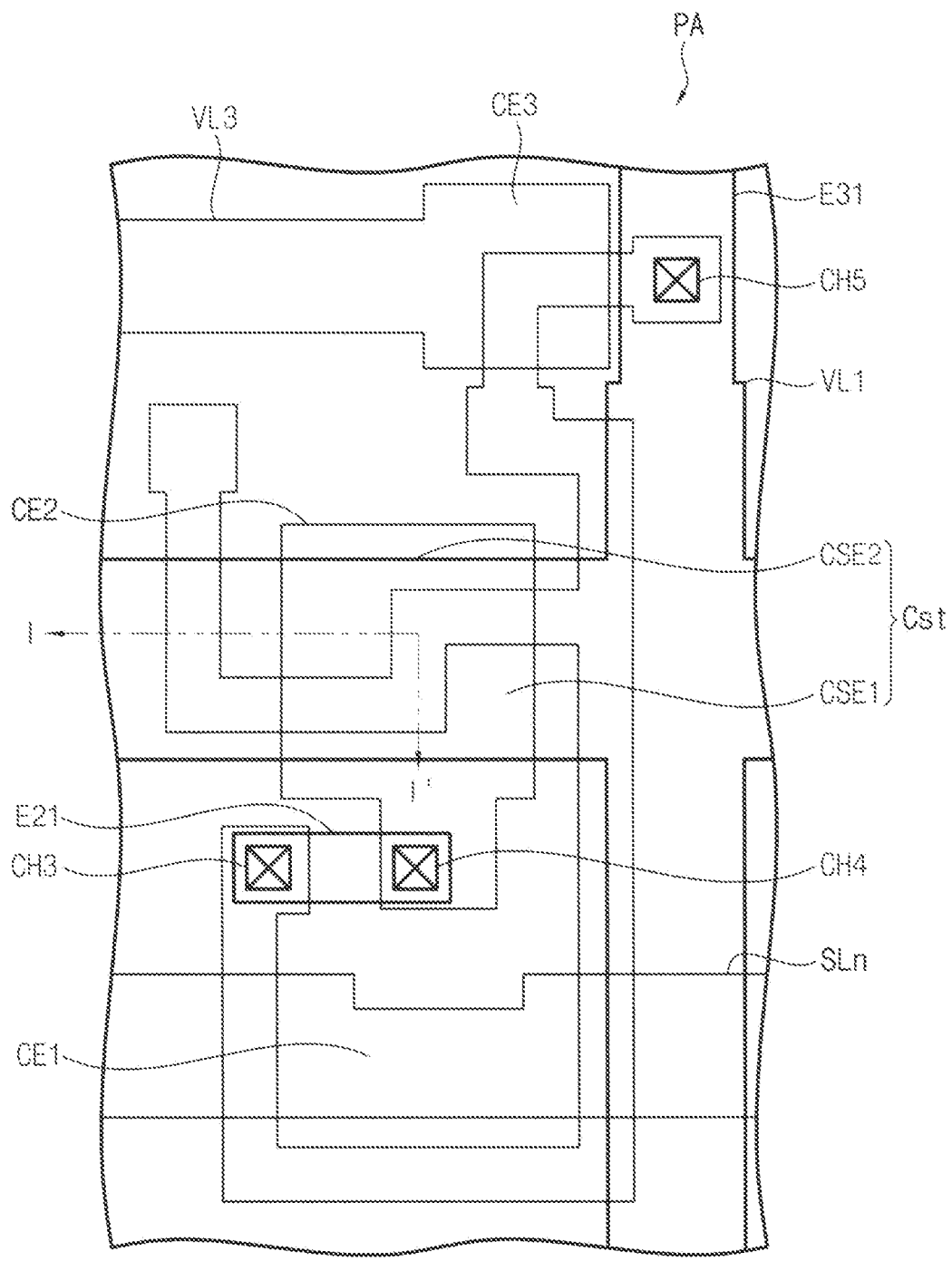

Referring to FIGS. 2, 14 and 16, a first insulating interlayer 113 may be disposed on the first conductive pattern MET1. The first insulating interlayer 113 may be formed of a silicon oxide, a silicon nitride, a silicon oxynitride, and etc. These may be used alone or in combination with each other.

The pixel circuit area PA may include a third contact part CH3, a fourth contact part CH4 and a fifth contact part CH5. The gate insulating layer 112 and the first insulating interlayer 113 are etched to form the third and fifth contact parts CH3 and CH5. The insulating interlayer 113 are etched to form the fourth contact part CH4.

A second conductive pattern MET2 which is patterned from a second conductive layer, may be disposed on the first insulating interlayer 113. The second conductive layer metal, alloy, metal nitride, conductive metal oxide, transparent conductive material, etc., which may be used alone or in combination thereof.

The second conductive pattern MET2 may include the first voltage line VL1, a second capacitor electrode CSE2 of the first capacitor Cst, a first electrode E21 of the second transistor T2 and the first electrode E31 of the third transistor T3.

The first voltage line VL1 may extend in the first direction D1. The second capacitor electrode CSE2 of the first capacitor Cst may extend in the second direction D2 from the first voltage line VL1. The first capacitor Cst may be defined by the first electrode CSE1 of the first conductive pattern MET1 and the second capacitor electrode CSE2 of the second conductive pattern MET2.

A first end portion of the first electrode E21 may be connected to the active pattern ACT through the third contact part CH3 and a second end portion of the first electrode E21 may be connected to the control electrode CE1 of the first transistor T1 through the fourth contact part CH4.

The first electrode E31 of the third transistor T3 may be defined in a portion area of the first voltage line VL1 and be connected to the active pattern ACT through the fifth contact part CH5.

Figure 17:
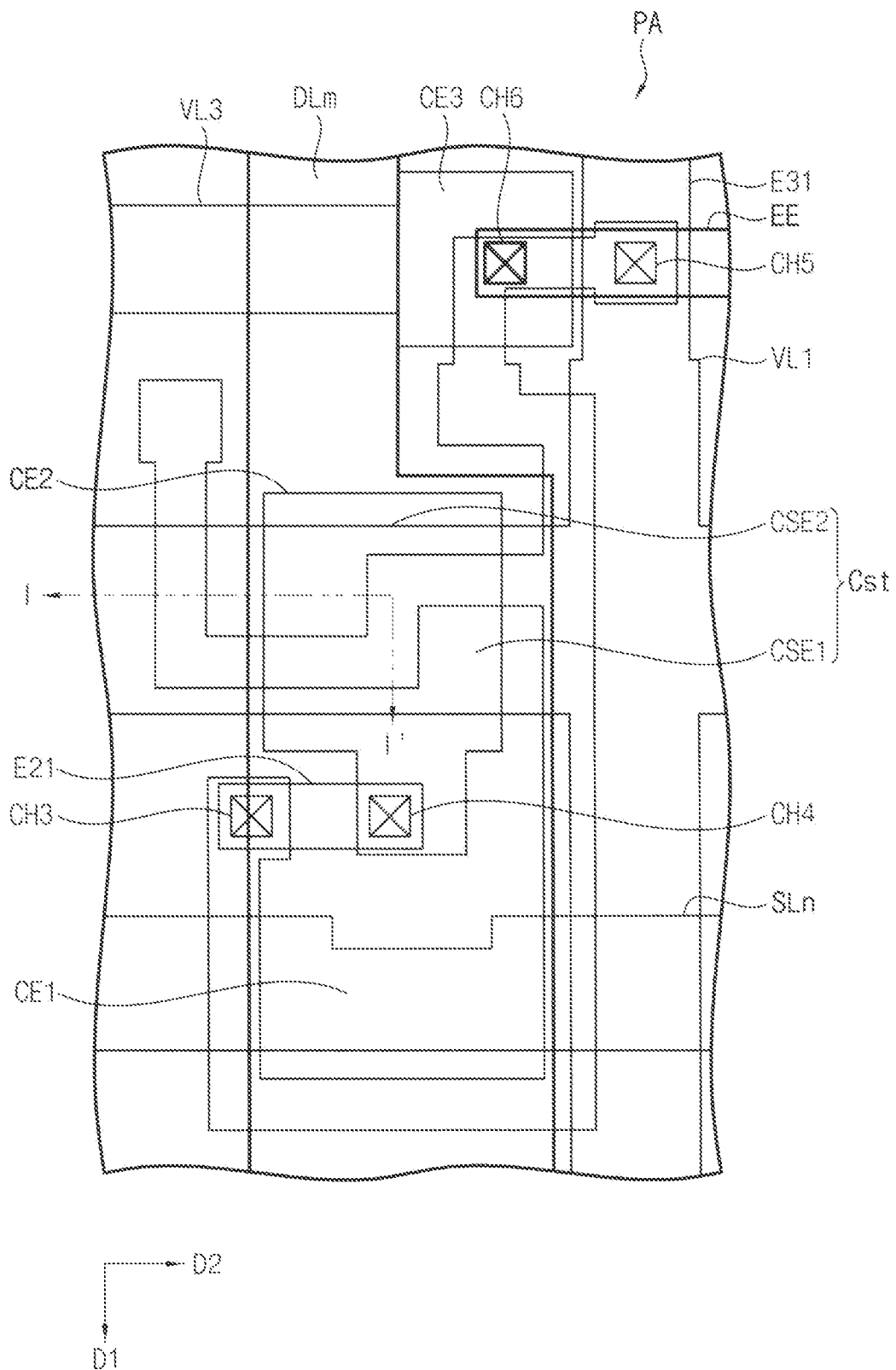

Referring to FIGS. 2, 14 and 17, a second insulating interlayer 114 may be disposed on the second conductive pattern MET2. The pixel circuit area PA may include a sixth contact part CH6 in which the first and second insulating interlayers 113 and 114 are etched.

A third conductive pattern MET3 which is patterned from a third conductive layer, may be disposed on the second insulating interlayer 114. The third conductive pattern MET3 may include the m-th data line DLm, a third capacitor electrode CPE1 of the second capacitor Cpr and a connection electrode EE.

The m-th data line DLm may extend in the first direction D1 and be disposed in the central area of the pixel circuit area PA.

The third capacitor electrode CPE1 of the second capacitor Cpr may extend from the m-th data line DLm.

The connection electrode EE may be connected to the third voltage line VL3 and a third voltage line VL3 which is disposed in an adjacent pixel circuit area, through the sixth contact part CH6.

Figure 18:
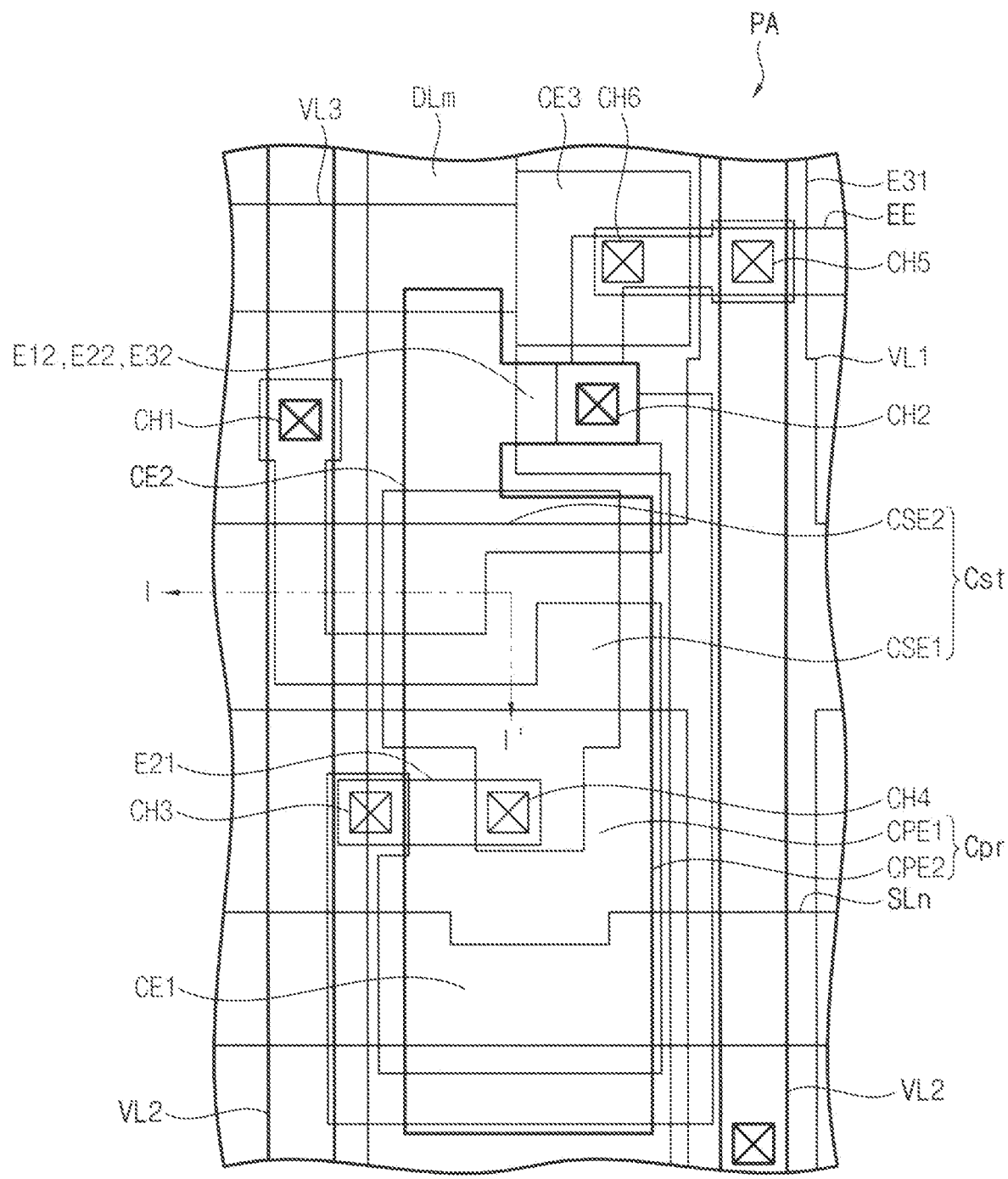

Referring to FIGS. 2, 14 and 18, a third insulating interlayer 115 may be disposed on the third conductive pattern MET3. The pixel circuit area PA may include a first contact part CH1 and a second contact part CH2 in which the gate insulating layer 112, the first insulating interlayer 113, the second insulating interlayer 114 and the third insulating interlayer 115 are etched.

A fourth conductive pattern MET4 which is patterned from a fourth conductive layer may be disposed on the third insulating interlayer 115.

The fourth conductive pattern MET4 may include the second voltage line VL2, the first electrode E11 of the first transistor T1, a fourth capacitor electrode CPE2 of the second capacitor Cpr, the second electrode E12 of the first transistor T1, the second electrode E22 of the second transistor T2 and the second electrode E32 of the third transistor T3.

The second voltage line VL2 may extend in the first direction D1 and may define a width of the pixel circuit area PA in the first direction D1 together with a second voltage line VL2 in the adjacent pixel circuit area PA.

The first electrode E11 of the first transistor T1 may be defined in a portion area of the second voltage line VL2 connected to the active pattern AC through the first contact part CH1.

The fourth capacitor electrode CPE2 of the second capacitor Cpr may have an island shape and be disposed in the central area of the pixel circuit area PA. The second capacitor Cpr may be defined by the third capacitor electrode CPE1 of the third conductive pattern MET3 and the fourth capacitor electrode CPE2 of the fourth conductive pattern MET4.

The second electrode E12 of the first transistor T1, the second electrode E22 of the second transistor T2 and the second electrode E32 of the third transistor T3 may respectively defined in portion areas of the fourth capacitor electrode CPE2 connected to the active pattern ACT through the second contact part CH2.

Figure 19:
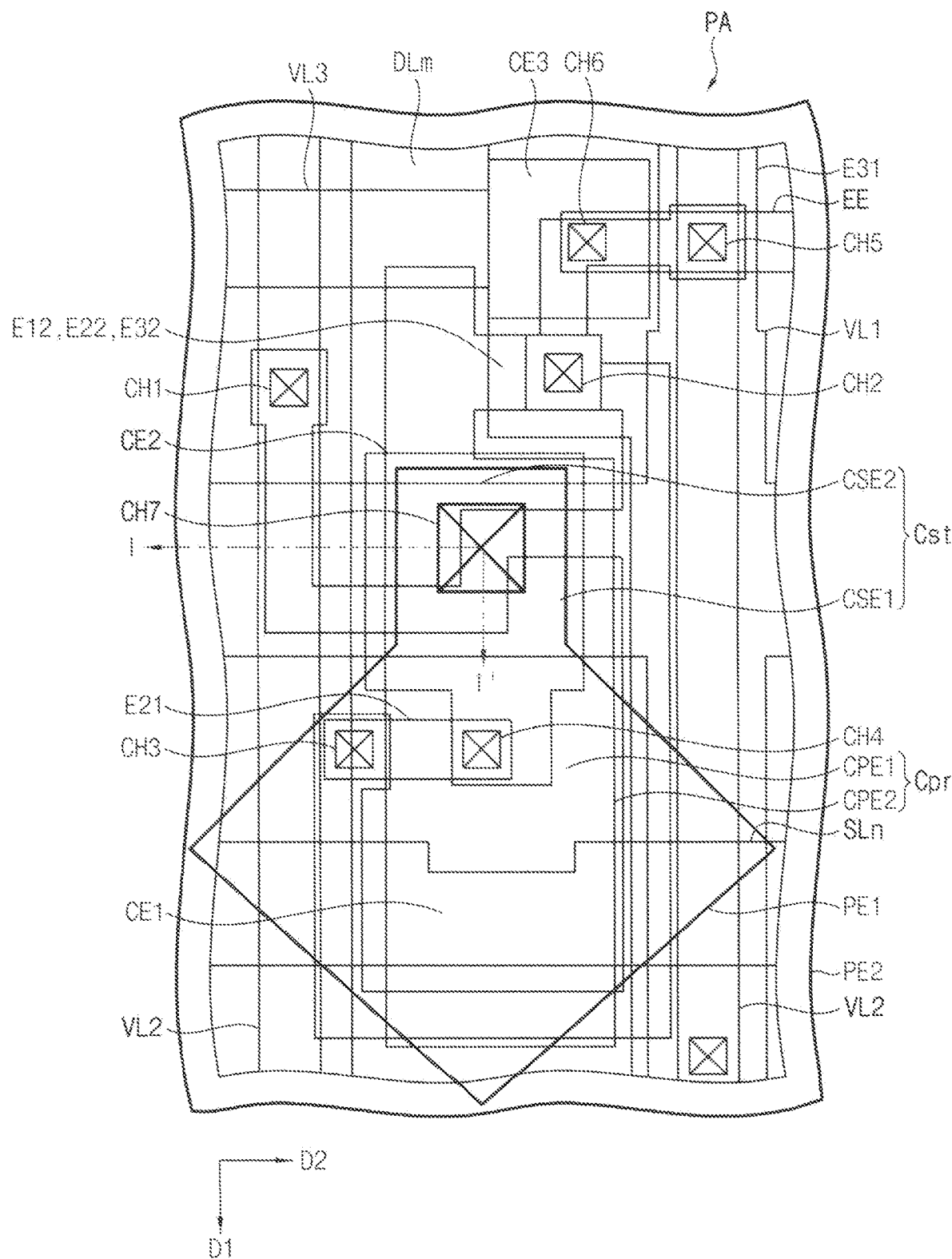

Referring to FIGS. 2, 14 and 19, a fourth insulating interlayer 116 may be disposed on the fourth conductive pattern MET4. The fourth insulating interlayer 116 may be formed with a high thickness to sufficiently cover the fourth conductive pattern MET4.

The pixel circuit area PA may include a seventh contact part CH7 in which the fourth insulating interlayer 116 is etched.

A first pixel electrode PE1 may be disposed on the fourth insulating interlayer 116. The first pixel electrode PE1 may correspond to the anode electrode of the organic light emitting diode.

A pixel defining layer 117 may be disposed on the fourth insulating interlayer 116 on which the first pixel electrode PE1 is formed.

The pixel defining layer 117 may form an opening on a portion area of the first pixel electrode PE1, and the organic light emitting layer EL may be disposed in the opening. Thus, the organic light emitting layer EL may be on the first pixel electrode PE1 exposed through the opening of the pixel defined layer 117.

A second pixel electrode PE2 may be disposed on the organic light emitting layer EL. The second pixel electrode PE2 may correspond to the cathode electrode of the organic light emitting diode. The second pixel electrode PE2 may be commonly disposed in the plurality of pixel circuit areas.

According to the exemplary embodiments, the pixel circuit may include only three transistors and two capacitors and thus, an ultra high definition display may be easily designed using the pixel circuit. In addition, the length of the compensating period in the frame period may be freely controlled and thus, a sufficient compensating period is obtained. In addition, whether the organic light emitting diode emits or not the light may be controlled by adjusting a level of the first power source signal.

The foregoing is illustrative of the inventive concept and is not to be construed as limiting thereof. Although a few exemplary embodiments of the inventive concept have been described, those skilled in the art will readily appreciate that many modifications are possible in the exemplary embodiments without materially departing from the novel teachings and advantages of the inventive concept. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:

1. A display panel comprising:
    a plurality of pixels, wherein a pixel of the plurality of pixels comprises:
    a light emitting element;
    a first transistor comprising a control electrode connected to a first node, a first electrode configured to receive a first power source signal and a second electrode connected to a first electrode of the light emitting element;
    a first capacitor connected between an initialization electrode and the first node;
    a second transistor comprising a control electrode configured to receive a scan signal, a first electrode connected to the first node and a second electrode connected to a first electrode of a second capacitor; and
    the second capacitor comprising the first electrode directly connected to the second electrode of the second transistor and a second electrode configured to receive a data voltage from a data line,
    wherein no transistor is connected between the second electrode of the second transistor and the data line.

2. The display panel of claim 1, wherein the pixel of the plurality of pixels further comprises:
    a third transistor directly connected between the initialization electrode and the first electrode of the light emitting element.

3. The display panel of claim 2, wherein the third transistor is directly connected to the second transistor.

4. The display panel of claim 2, wherein the third transistor is directly connected to the second capacitor.

5. The display panel of claim 1, wherein the pixel of the plurality of pixels further comprises:
    a third transistor directly connected to the first electrode of the light emitting element, the first electrode of the second capacitor and the second electrode of the second transistor.

6. The display panel of claim 1, wherein the first electrode of the light emitting element is an anode electrode of the light emitting element.

7. The display panel of claim 1, wherein a second electrode of the light emitting element is configured to receive a second power source signal.

8. The display panel of claim 7, wherein the second electrode of the light emitting element is a cathode electrode of the light emitting element.

* * * * *